US012745384B2

(12) United States Patent
Sonoda

(10) Patent No.: US 12,745,384 B2
(45) Date of Patent: Sep. 22, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventor: Yasuyuki Sonoda, Kumage (JP)

(73) Assignee: Kioxia Corporation, Tokyo (JP)

( * ) Notice: Subject to any disclaimer, the term of this patent is extended or adjusted under 35 U.S.C. 154(b) by 523 days.

(21) Appl. No.: 18/334,720

(22) Filed: Jun. 14, 2023

(65) Prior Publication Data

US 2024/0098976 A1 Mar. 21, 2024

(30) Foreign Application Priority Data

Sep. 20, 2022 (JP) ................................ 2022-149472

(51) Int. Cl.
*H10B 12/00* (2023.01)

(52) U.S. Cl.
CPC ............ *H10B 12/33* (2023.02); *H10B 12/02* (2023.02)

(58) Field of Classification Search
CPC ........ H10B 12/02; H10B 12/05; H10B 12/33; H10B 12/0383; H10B 12/38; H10B 12/39; H10B 12/395
See application file for complete search history.

(56) References Cited

U.S. PATENT DOCUMENTS

2008/0209876 A1* 9/2008 Miller ............... H01M 10/0565 204/192.12
2012/0261747 A1* 10/2012 Park ....................... H10B 61/22 257/330
2019/0088791 A1* 3/2019 Bu ..................... H10D 30/6757
2019/0305081 A1 10/2019 Lajoie et al.
2023/0098062 A1* 3/2023 Sukekawa .............. H10B 12/03 257/296

OTHER PUBLICATIONS

Norio Hirashita et al., "Thermal Desorption and Infrared Studies of Plasma-Enhanced Chemical Vapor Deposited SiO Films with Tetraethylorthosilicate", Japanese Journal of Applied Physics, vol. 32 (1993), Part 1, No. 4, pp. 1787-1793 (8 pages).

* cited by examiner

*Primary Examiner* — Britt Hanley
*Assistant Examiner* — Kevin Quinto
(74) *Attorney, Agent, or Firm* — Oblon, McClelland, Maier & Neustadt, L.L.P.

(57) ABSTRACT

A semiconductor device includes: a first conductor; a second conductor; an oxide semiconductor layer provided between the first conductor and the second conductor and extending in a first direction; a first wiring extending in a second direction across the first direction and surrounding the oxide semiconductor layer; an insulating film provided between the first wiring and the oxide semiconductor layer; a second wiring provided on the second conductor and extending in a third direction across each of the first direction and the second direction; a first insulating layer provided on a side surface of the second wiring and having a first void; and a second insulating layer provided on the first insulating layer and having a second void.

18 Claims, 19 Drawing Sheets

11

156
S2
151
143a
142a
140a
144
S1
141a
132a
132
129
133
130
131
128
123
122
MTR
121
125
119
116
115
113
MCP
118
111

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2022-149472, filed on Sep. 20, 2022; the entire contents of which are incorporated herein by reference.

FIELD

Embodiments relate to a semiconductor device and a method for manufacturing the semiconductor device.

BACKGROUND

A semiconductor memory device to be used, has bit lines, word lines, and memory cells (transistors and capacitors) connected to the word lines and the bit lines. The semiconductor memory device can select one or more of the bit lines and one or more of the word lines and applying voltages the selected lines to writ and read to/from a selected memory cell.

DETAILED DESCRIPTION

Figure 1:
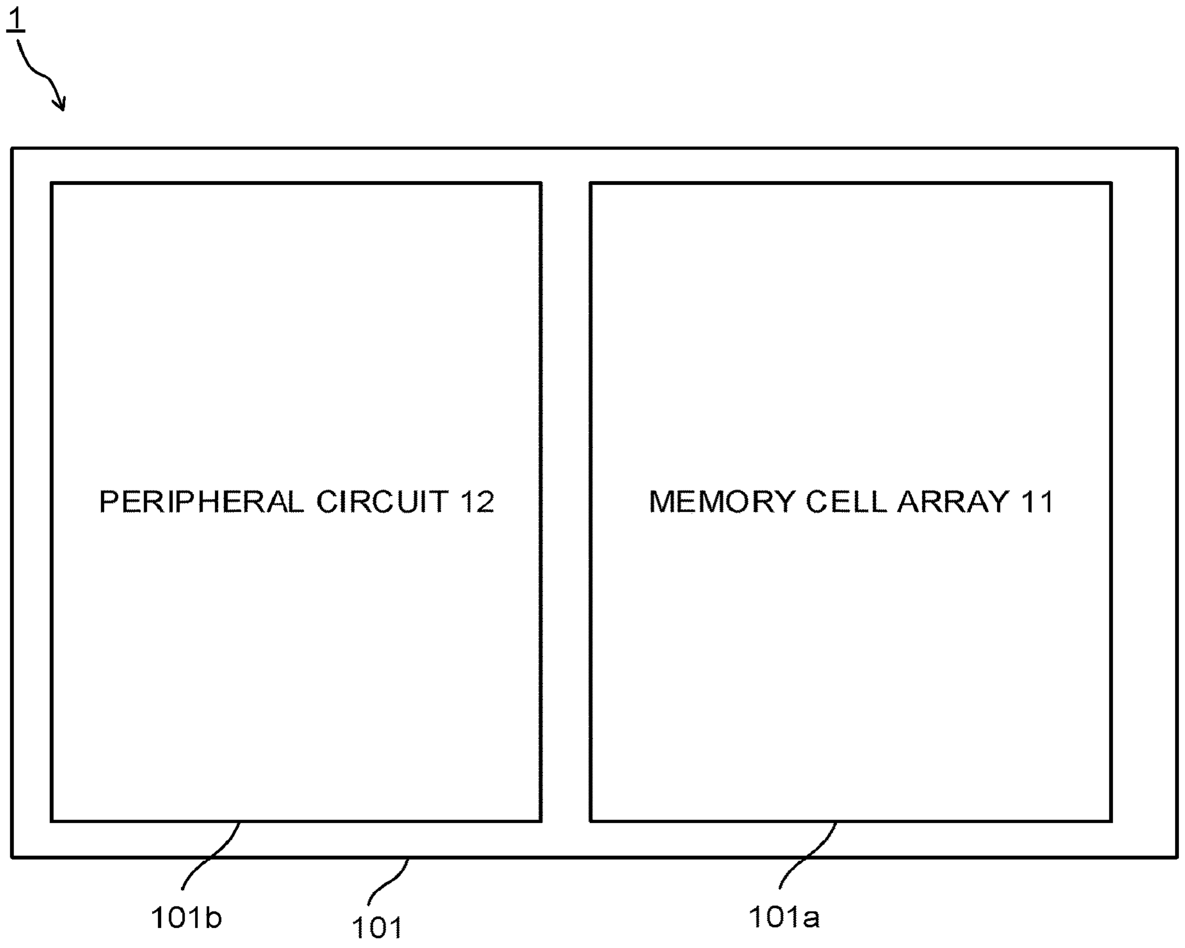
FIG. 1 is a block diagram illustrating a configuration embodiment of a semiconductor device.

A semiconductor device in an embodiment includes: a first conductor; a second conductor; an oxide semiconductor layer provided between the first conductor and the second conductor and extending in a first direction; a first wiring extending in a second direction across the first direction and surrounding the oxide semiconductor layer; an insulating film provided between the first wiring and the oxide semiconductor layer; a second wiring provided on the second conductor and extending in a third direction across each of the first direction and the second direction; a first insulating layer provided on a side surface of the second wiring and having a first void; and a second insulating layer provided on the first insulating layer and having a second void.

Embodiments will be hereinafter explained with reference to the drawings. A relation between the thickness and planar dimension of each of components illustrated in the drawings, a thickness ratio among the components, and so on may be different from actual ones. The vertical direction may be different from the vertical direction according to the gravitational acceleration. In the embodiments, substantially the same components are denoted by the same reference signs and an explanation thereof is omitted where appropriate.

"Connecting" herein includes not only physically connecting but also electrically connecting, and includes not only directly connecting but also indirectly connecting unless otherwise specified.

FIG. 1 is a block diagram illustrating a configuration embodiment of a semiconductor device. The semiconductor device 1 illustrated in FIG. 1 is a dynamic random access memory (DRAM), and has a semiconductor substrate 101 which has a region 101*a* including a memory cell array 11 and a region 101*b* including a peripheral circuit 12.

Figure 2:
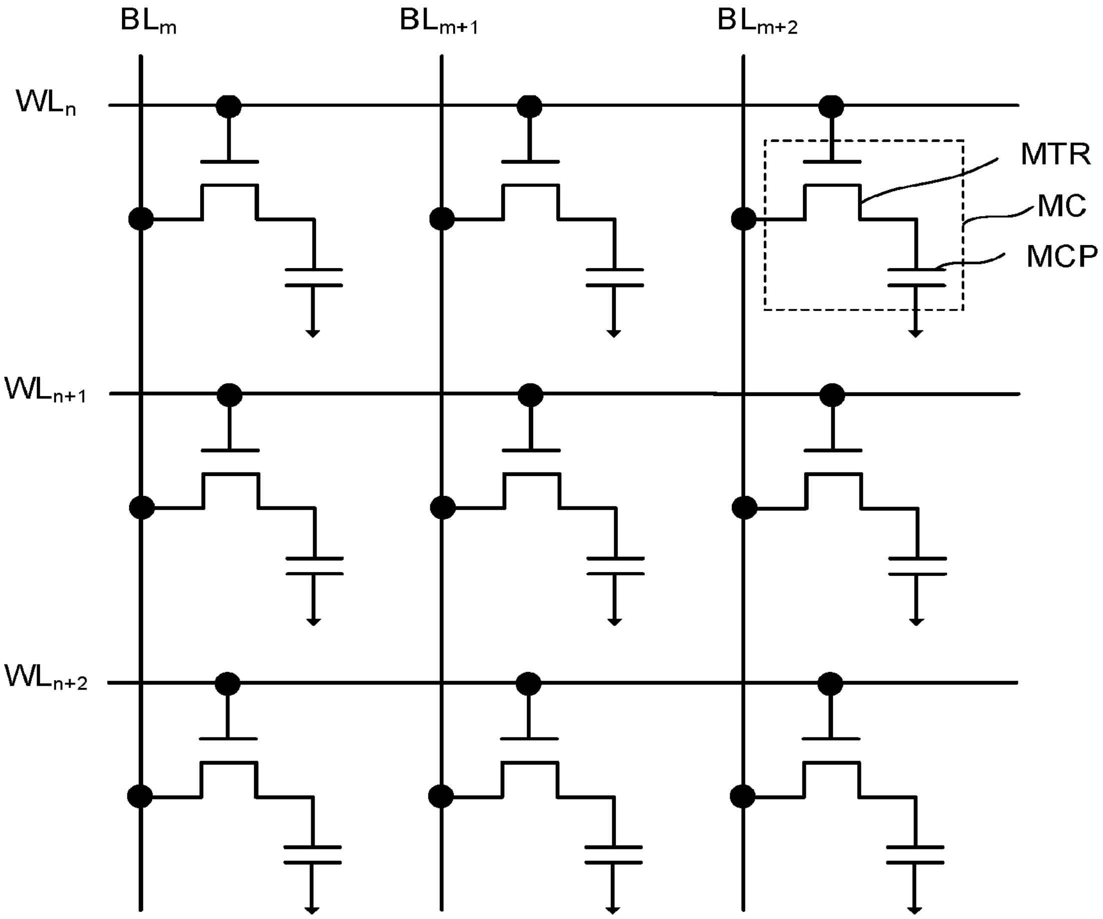
FIG. 2 is a circuit diagram for explaining a circuit configuration embodiment of a memory cell array.

FIG. 2 is a circuit diagram for explaining an circuit configuration embodiment of the memory cell array. FIG. 2 illustrates a plurality of memory cells MC, a plurality of word lines WL (word line $WL_n$, word line $WL_{n+1}$, word line $WL_{n+2}$, n being an integer), and a plurality of bit lines BL (bit line $BL_m$, bit line $BL_{m+1}$, bit line $BL_{m+2}$, m being an integer).

The plurality of memory cells MC are arrayed in row and column directions to form the memory cell array 11. Each of the memory cells MC includes a memory transistor MTR that is a field-effect transistor (FET) and a memory capacitor MCP. A gate of the memory transistor MTR is connected to a corresponding word line WL, and one of a source and a drain is connected to a corresponding bit line BL. One electrode of the memory capacitor MCP is connected to the other of the source and the drain of the memory transistor MTR, and the other electrode is connected to a not-illustrated power supply line which supplies a specific potential. The memory cell MC can accumulate electric charges in the memory capacitor MCP from the bit line BL by switching of the memory transistor MTR by the word line WL to hold data. The number of plurality of memory cells MC is not limited to the number illustrated in FIG. 2.

Figure 3:
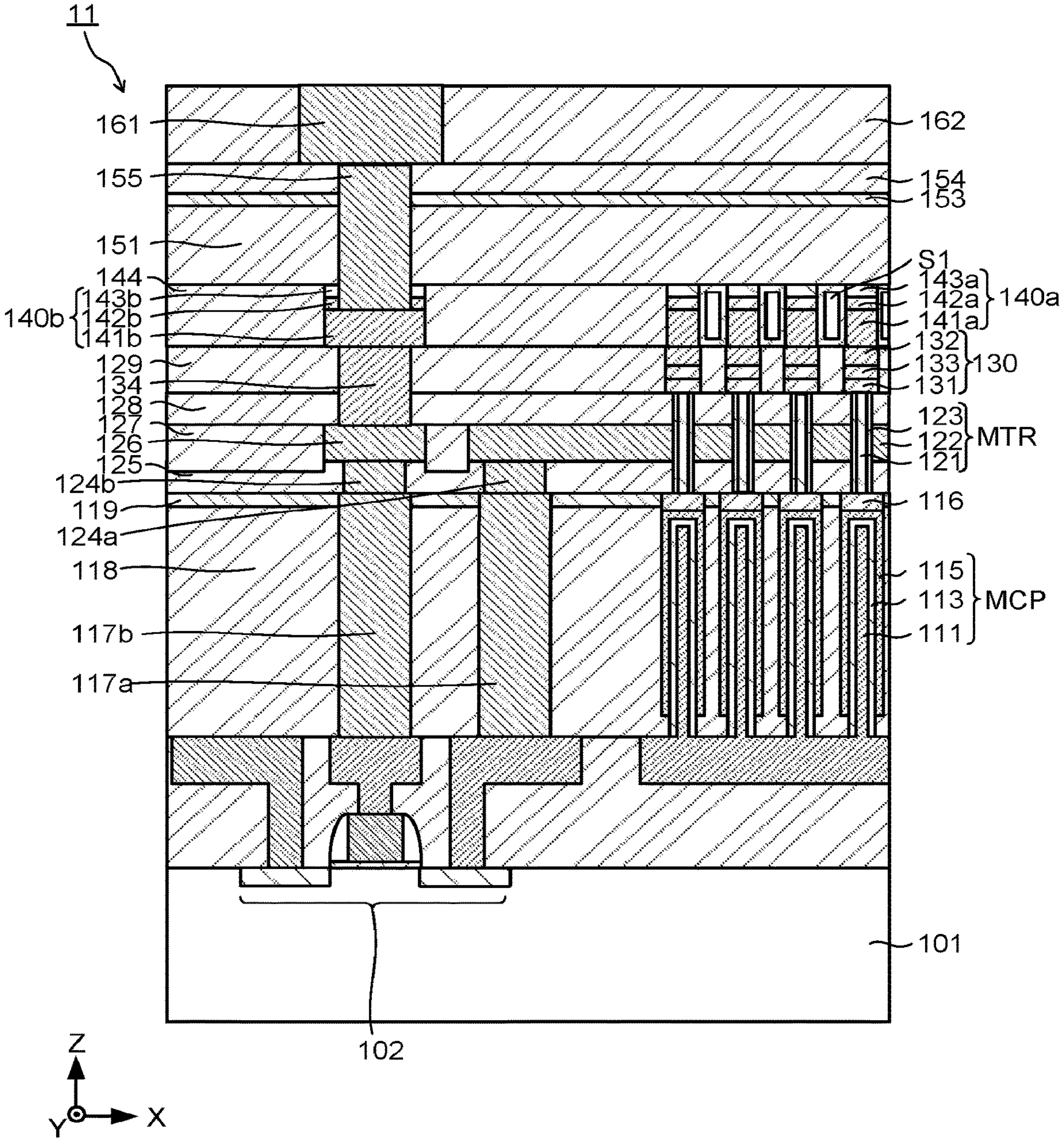
FIG. 3 is a cross-sectional schematic view for explaining an structure embodiment of the semiconductor device.

FIG. 3 is a cross-sectional schematic view for explaining an structure embodiment of the semiconductor device, and illustrates a part of an X-Z cross-section including an X-axis of the semiconductor device and a Z-axis orthogonal to the X-axis.

The semiconductor device illustrated in FIG. 3 includes the semiconductor substrate 101, a field-effect transistor 102, a conductor 111, an insulator 113, an electric conductor 115, a conductive oxide layer 116, a conductor 117*a*, a conductor 117*b*, an insulating layer 118, an insulating layer 119, an oxide semiconductor layer 121, a conductive layer 122, an insulating layer 123, a conductor 124*a*, a conductor 124*b*, an insulating layer 125, a conductive layer 126, an insulating layer 127, an insulating layer 128, an insulating layer 129, a conductor 130, a stack 140*a*, a stack 140*b*, an insulating layer 144, an insulating layer 151, an insulating layer 153, an insulating layer 154, a conductor 155, a conductor 161, and an insulating layer 162.

The field-effect transistor 102 is included in the peripheral circuit 12. The peripheral circuit 12 includes, for example, a sense amplifier. The field-effect transistor 102 is, for example, a P-channel type field-effect transistor (Pch-FET), or an N-channel type field-effect transistor (Nch-FET). The field-effect transistor 102 can be formed using the semiconductor substrate 101 such as a monocrystalline silicon substrate, and has a channel region, a source region, and a drain region in the semiconductor substrate 101. The semiconductor substrate 101 may have a P-type conductivity type.

The conductor 111, the insulator 113, and the electric conductor 115 form the memory capacitor MCP. FIG. 3 illustrates four memory capacitors MCP, but the number of memory capacitors MCP is not limited to four.

The memory capacitor MCP is a three-dimensional capacitor such as a so-called pillar capacitor or cylinder capacitor. The conductor 111 has a pillar extending in the Z-axis direction, and has a function as the other electrode of the memory capacitor MCP. The insulator 113 is provided in a manner to surround the pillar on the pillar of the conductor 111, and has a function as a dielectric layer of the memory capacitor MCP. The electric conductor 115 is provided on the insulator 113, surrounds the pillar of the conductor 111 with the insulator 113 intervening therebetween, and has a function as the one electrode of the memory capacitor MCP.

The conductor 111 contains, for example, tungsten, titanium nitride, or the like. The insulator 113 contains, for example, hafnium oxide, zirconium oxide, aluminum oxide, or the like. The electric conductor 115 contains, for example, amorphous silicon or the like.

The conductive oxide layer 116 is provided on the electric conductor 115. The conductive oxide layer 116 contains, for example, indium (In), tin (Sn), and oxygen (O). The conductive oxide layer 116 contains a metal oxide such as indium-tin-oxide (ITO).

The conductor 117*a* is electrically connected to, for example, a source electrode or a drain electrode of the field-effect transistor 102. The conductor 117*a* has a function as a via. The conductor 117*a* contains metal such as copper or tungsten.

The conductor 117*b* is electrically connected to, for example, a gate electrode of the field-effect transistor 102. The conductor 117*b* has a function as a via. The conductor 117*b* contains metal such as copper or tungsten.

The insulating layer 118 is provided, for example, between the plurality of memory capacitors MCP. The insulating layer 118 contains, for example, silicon and oxygen.

The insulating layer 119 is provided on the insulating layer 118. The insulating layer 119 contains, for example, silicon and nitrogen.

The oxide semiconductor layer 121, the conductive layer 122, and the insulating layer 123 form the memory transistor MTR. The memory transistor MTR is provided above the memory capacitor MCP, and forms the memory cell MC together with the memory capacitor MCP.

The oxide semiconductor layer 121 has, for example, a pillar extending in the Z-axis direction. The oxide semiconductor layer 121 forms a channel of the memory transistor MTR. The oxide semiconductor layer 121 may contain, for example, at least one element selected from the group consisting of indium (In), gallium (Ga), silicon (Si), aluminum (Al), and tin (Sn), zinc (Zn), and oxygen (O). The oxide semiconductor layer 121 may contain, for example, at least one element selected from the group consisting of titanium (Ti), zinc (Zn), and tungsten (W), and oxygen (O). The oxide semiconductor layer 121 may contain, for example, titanium oxide, zinc oxide, or tungsten oxide. The oxide semiconductor layer 121 may be, for example, a titanium oxide layer, a zinc oxide layer, or a tungsten oxide layer. The oxide semiconductor layer 121 contains, for example, indium oxide and gallium oxide, indium oxide and zinc oxide, or indium oxide and tin oxide. In one example, the oxide semiconductor layer 121 may contain oxide containing indium, gallium, and zinc (indium-gallium-zinc-oxide), that is, a so-called IGZO (InGaZnO). The oxide semiconductor layer 121 may have, for example, a chemical composition different from a chemical composition of the conductive oxide layer 116 and a chemical composition of the conductive oxide layer 131.

One end in the Z-axis direction of the oxide semiconductor layer 121 is connected to a conductive layer 132 via a conductive oxide layer 131 and functions as one of the source and the drain of the memory transistor MTR, and another end is connected to the conductive oxide layer 116 and functions as the other of the source and the drain of the memory transistor MTR. In this case, the conductive oxide layer 116 is provided between the electric conductor 115 of the memory capacitor MCP and the oxide semiconductor layer 121 of the memory transistor MTR, and functions as the other of the source electrode and the drain electrode of the memory transistor MTR. The conductive oxide layer 116 contains a metal oxide as with the oxide semiconductor layer 121 of the memory transistor MTR, and therefore can reduce the connection resistance between the memory transistor MTR and the conductive oxide layer 116.

The conductive layer 122 extends in the X-axis direction. The conductive layer 122 surrounds the oxide semiconductor layer 121 with the insulating layer 123 intervening therebetween in an X-Y plane. The conductive layer 122 forms the gate electrode of the memory transistor MTR and forms the word line WL as wiring. The conductive layer 122 contains, for example, a metal, a metallic compound, or a semiconductor. The conductive layer 122 contains, for example, at least one selected from the group consisting of tungsten (W), titanium (Ti), titanium nitride (TiN), molybdenum (Mo), cobalt (Co), and ruthenium (Ru).

The insulating layer 123 is provided between the oxide semiconductor layer 121 and the conductive layer 122 in the X-Y plane. The insulating layer 123 forms a gate insulating film of the memory transistor MTR. The insulating layer 123 contains, for example, silicon, and oxygen or nitrogen.

The memory transistor MTR is a so-called Surrounding Gate Transistor (SGT) in which the gate electrode is arranged in a manner to surround the channel. The SGT can reduce the area of the semiconductor device.

The field-effect transistor having the channel layer including the oxide semiconductor is lower in off-leakage current than the field-effect transistor provided on the semiconductor substrate 101. Therefore, for example, the data held in the memory cell MC can be held for a long time, so that it is possible to reduce the number of times of the refresh operation. The field-effect transistor having the channel layer containing the oxide semiconductor can be formed by a low-temperature process, so that it is possible to prevent heat stress on the memory capacitor MCP.

The conductor 124*a* is provided on the conductor 117*a* and electrically connected to the conductor 117*a*. The conductor 124*a* contains, for example, at least one selected from the group consisting of tungsten, titanium, titanium nitride, molybdenum, cobalt, and ruthenium.

The conductor 124*b* is provided on the conductor 117*b* and electrically connected to the conductor 117*b*. The conductor 124*b* contains, for example, at least one selected from the group consisting of tungsten, titanium, titanium nitride, molybdenum, cobalt, and ruthenium.

The insulating layer 125 is provided on the insulating layer 119. The insulating layer 125 is provided between the plurality of memory transistors MTR and between the conductor 124*a* and the conductor 124*b*.

The conductive layer 126 is provided on the conductor 124*b* and electrically connected to the conductor 124*b*. The conductive layer 126 is formed by the same step as that of the conductive layer 122. Therefore, the conductive layer 126 contains a material applicable to the conductive layer 122.

The insulating layer 127 is provided on the insulating layer 125. The insulating layer 127 is provided between the conductive layer 122 and the conductive layer 126. The insulating layer 127 contains, for example, silicon, and oxygen or nitrogen.

The insulating layer 128 is provided on the insulating layer 127. The insulating layer 128 is provided between the plurality of memory transistors MTR on the insulating layer 127. The insulating layer 128 contains, for example, silicon, and oxygen or nitrogen.

The insulating layer 129 is provided on the insulating layer 128. The insulating layer 129 contains, for example, silicon, and oxygen or nitrogen.

The conductor 130 has the conductive oxide layer 131, the conductive layer 132, and a conductive layer 133. The conductor 130 is electrically connected to the field-effect transistor 102 via the bit line BL. The conductor 130 has, for example, a function as a conductive pad for connecting to the memory transistor MTR and the bit line BL.

The conductive oxide layer 131 is a conductive layer containing a metal oxide. The conductive oxide layer 131 is provided on the oxide semiconductor layer 121 of the memory transistor MTR, and functions as one of the source electrode and the drain electrode of the memory transistor MTR. The conductive oxide layer 131 contains a metal oxide such as indium-tin-oxide (ITO). The conductive oxide layer 131 contains the metal oxide as with the oxide semiconductor layer 121, and therefore can reduce the connection resistance between the memory transistor MTR and the conductive oxide layer 131.

The conductive layer 132 is provided above the conductive oxide layer 131. The conductive layer 132 contains a metallic element. The conductive layer 132 contains, for example, at least one selected from the group consisting of tungsten, titanium, titanium nitride, molybdenum, cobalt, and ruthenium.

The conductive layer 132 is provided above the conductive oxide layer 131 and connected to the oxide semiconductor layer 121 of the memory transistor MTR via the conductive oxide layer 131 and the conductive layer 133. The conductive oxide layer 131 functions as one of the source electrode and the drain electrode of the memory transistor MTR.

The conductive layer 133 is provided between the conductive oxide layer 131 and the conductive layer 132. The conductive layer 133 is, for example, a metallic compound layer, and contains, for example, titanium and nitrogen. The formation of the conductive layer 133 makes it possible to prevent the diffusion of oxygen from the conductive oxide layer 131 to the conductive layer 132.

A conductor 134 is provided on the conductive layer 126 and penetrates the insulating layer 128 and the insulating layer 129 in the Z-axis direction. The conductor 134 has a function as a via. The conductor 134 contains, for example, copper.

The stack 140*a* is provided on the conductor 130 and electrically connected to the conductor 130. The stack 140*a* forms the bit line BL as wiring.

The stack 140*b* is provided on the conductor 134 and electrically connected to the conductor 134.

The stack 140*a* has a conductive layer 141*a*, an insulating layer 142*a* on the conductive layer 141*a*, and an insulating layer 143*a* on the insulating layer 142*a*. The stack 140*b* has a conductive layer 141*b*, an insulating layer 142*b* on the conductive layer 141*b*, and an insulating layer 143*b* on the insulating layer 142*b*.

The conductive layer 141*a* and the conductive layer 141*b* are formed by the same step. The conductive layer 141*a* and the conductive layer 141*b* contain, for example, at least one selected from the group consisting of tungsten, titanium, titanium nitride, molybdenum, cobalt, and ruthenium.

The insulating layer 142*a* and the insulating layer 142*b* are formed by the same step. The insulating layer 142*a* and the insulating layer 142*b* contain, for example, silicon and oxygen.

The insulating layer 143*a* and the insulating layer 143*b* are formed by the same step. The insulating layer 143*a* and the insulating layer 143*b* contain, for example, silicon and nitrogen.

The insulating layer 144 is provided on the insulating layer 129. The insulating layer 144 is provided between a plurality of stacks 140*a* and is in contact with the side surfaces of the stacks 140*a*. The insulating layer 144 contains, for example, silicon and oxygen.

The insulating layer 144 has a void S1. The void S1 is provided, for example, between the plurality of stacks 140*a*. The void S1 extends, for example, in a Y-axis direction orthogonal to each of the X-axis and the Z-axis. The void S1 may have, for example, a hole shape. The void S1 may be filled, for example, with air.

The insulating layer 151 is provided on the insulating layer 144. The insulating layer 151 contains, for example, silicon and oxygen.

The insulating layer 153 is provided on the insulating layer 151. The insulating layer 153 contains, for example, silicon and nitrogen. The insulating layer 153 does not necessarily have to be provided.

The insulating layer 154 is provided on the insulating layer 153. The insulating layer 154 contains, for example, silicon and oxygen.

The conductor 155 is provided on the conductive layer 141*b* and electrically connected to the conductive layer 141*b*. The conductor 155 penetrates the insulating layer 142*b*, the insulating layer 143*b*, the insulating layer 151, the insulating layer 153, and the insulating layer 154 in the Z-axis direction. The conductor 155 contains metal such as copper or tungsten.

The conductor 161 is provided on the conductor 155 and electrically connected to the conductor 155. The conductor 161 contains metal such as copper or tungsten. The conductor 161 may be a stack.

The insulating layer 162 is provided on the insulating layer 154. The insulating layer 162 contains, for example, silicon, and oxygen or nitrogen.

In the case of forming the memory cell array 11 illustrated in FIG. 3, oxygen is likely to remove from the oxide semiconductor layer 121. If oxygen removes, a threshold voltage of the memory transistor MTR shifts to a negative direction, thus deteriorating the electric property of the memory transistor MTR. Hence, a heat treatment under an oxygen atmosphere after the formation of the oxide semiconductor layer 121 is performed to supply oxygen to the oxide semiconductor layer 121. This can prevent the shift of the threshold voltage of the memory transistor MTR. The insulating layer 151 can be formed, for example, by the chemical vapor deposition method (CVD), but oxygen is likely to remove from the oxide semiconductor layer 121 also due to the heat generated during the formation, and therefore the heat treatment is preferably performed under an oxygen atmosphere after the formation of the insulating layer 151.

However, in the case of performing the heat treatment after the formation of the insulating layer 151, the supply efficiency of oxygen to the oxide semiconductor layer 121 is low in some cases. This becomes more remarkable as the insulating layer 151 becomes thicker. If the supply efficiency of oxygen to the oxide semiconductor layer 121 deceases, it becomes difficult to sufficiently prevent the shift of the threshold voltage of the memory transistor MTR. This causes an operation failure of the memory transistor MTR and lowers the reliability of the semiconductor device.

In contrast to the above, the memory cell array of the semiconductor device in this embodiment includes the insulating layer 151 having the void and thereby can prevent a decrease in reliability of the semiconductor device. A concrete structure embodiment of the memory cell array including the insulating layer 151 having the void will be explained below.

First Structure Embodiment of the Memory Cell Array

Figure 4:
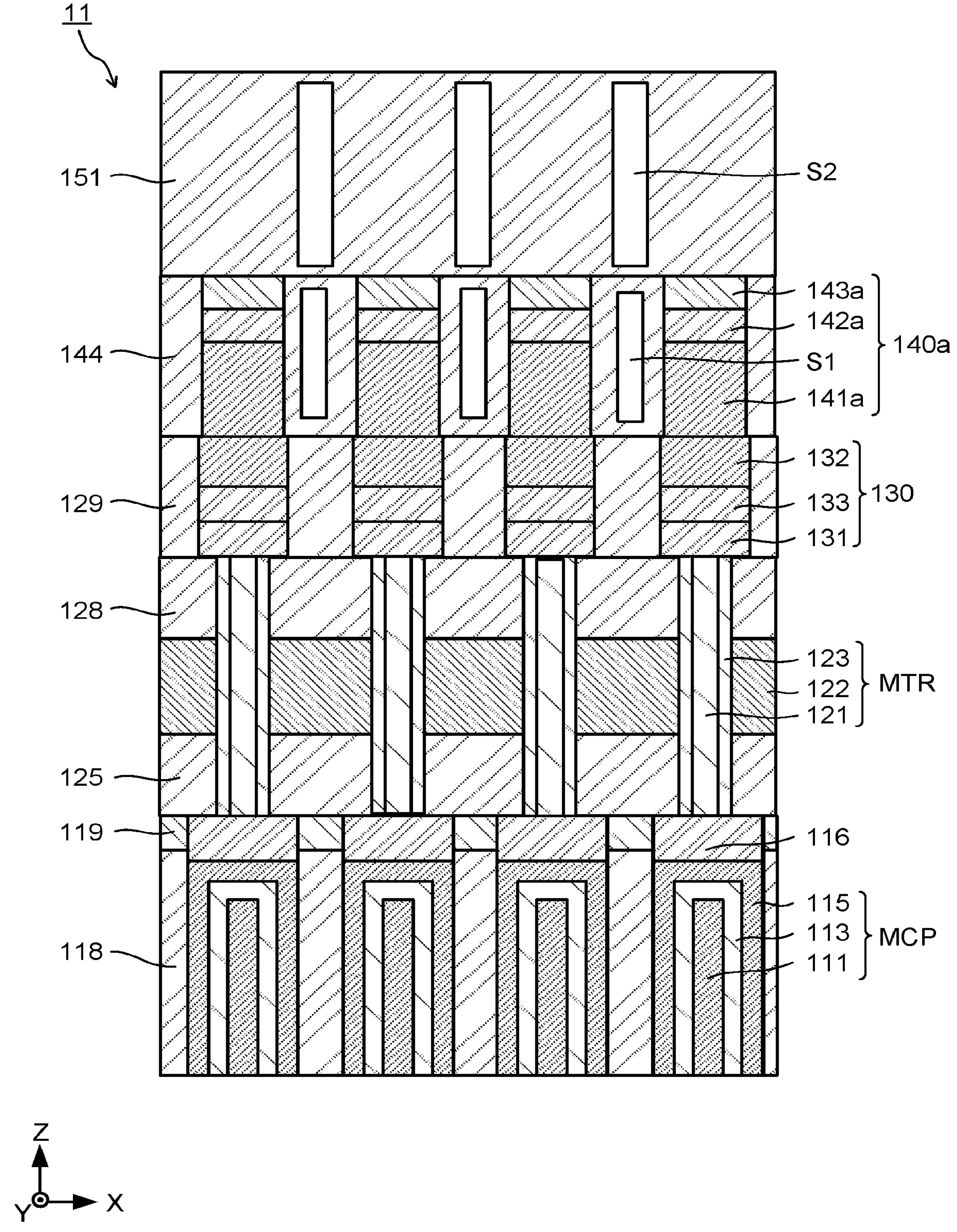
FIG. 4 is a cross-sectional schematic view for explaining a first structure embodiment of the memory cell array.

FIG. 4 is a cross-sectional schematic view for explaining a first structure embodiment of the memory cell array 11 in the embodiment. Parts different from those in FIG. 3 will be explained below, and for the other parts, the explanation of FIG. 3 can be used as appropriate.

The memory cell array 11 illustrated in FIG. 4 further includes a void S2 provided in the insulating layer 151 illustrated in FIG. 3. The void S2 extends, for example, in the Y-axis direction. The void S2 may have, for example, a hole shape.

During the formation of the insulating layer 151, a vacancy (pore) is generated in the insulating layer 151 in some cases. The void S2 has a size much larger than that of the vacancy. The void S2 is provided above the void S1. The void S1 and the void S2 only need to be provided at positions at least partially overlapping in the X-Y plane. Forming the void S2 at the position overlapping the void S1 makes it possible to increase the supply efficiency of oxygen to the oxide semiconductor layer 121.

Figure 5:
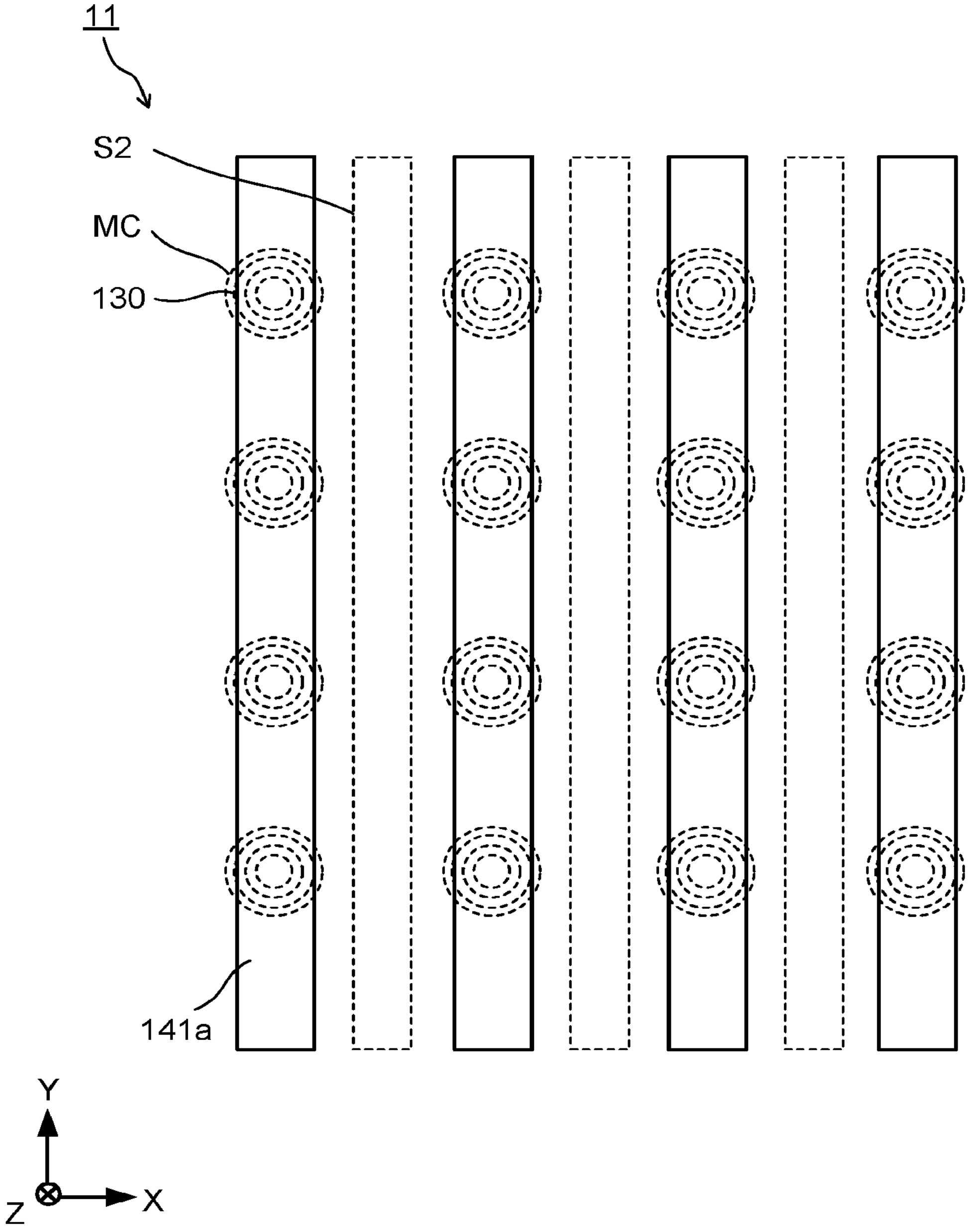
FIG. 5 is a planar schematic view for explaining the first structure embodiment of the memory cell array.

FIG. 5 is a planar schematic view for explaining the first structure embodiment of the memory cell array 11 in the embodiment. FIG. 5 illustrates the memory cell MC, the conductor 130, and the conductive layer 141*a* with the illustration of the other components omitted for convenience.

The plurality of conductive layers 141*a* (bit lines BL) extend in the Y-axis direction and are arranged apart from one another in the X-axis direction. Each of the conductive layers 141*a* overlaps a plurality of memory cells MC in the Y-axis direction.

The plurality of memory cells MC form a matrix arrangement in the X-Y plane as illustrated in FIG. 5. The number of memory cells MC is not particularly limited.

The void S2 extends in the Y-axis direction. The void S2 is provided, for example, between the plurality of conductive layers 141*a* (bit lines BL).

Method Embodiment of Manufacturing the First Structure Embodiment

A method embodiment of manufacturing the first structure embodiment will be explained with reference to FIG. 6, FIG. 7, FIG. 8, and FIG. 9. FIG. 6 to FIG. 9 are cross-sectional schematic views for explaining the method embodiment of manufacturing the first structure embodiment. FIG. 6 to FIG. 9 illustrate a cross section including the X-axis and the Z-axis. Here, manufacturing steps from the formation of an insulating film 151*a* to the performance of the heat treatment will be explained.

Figure 6:
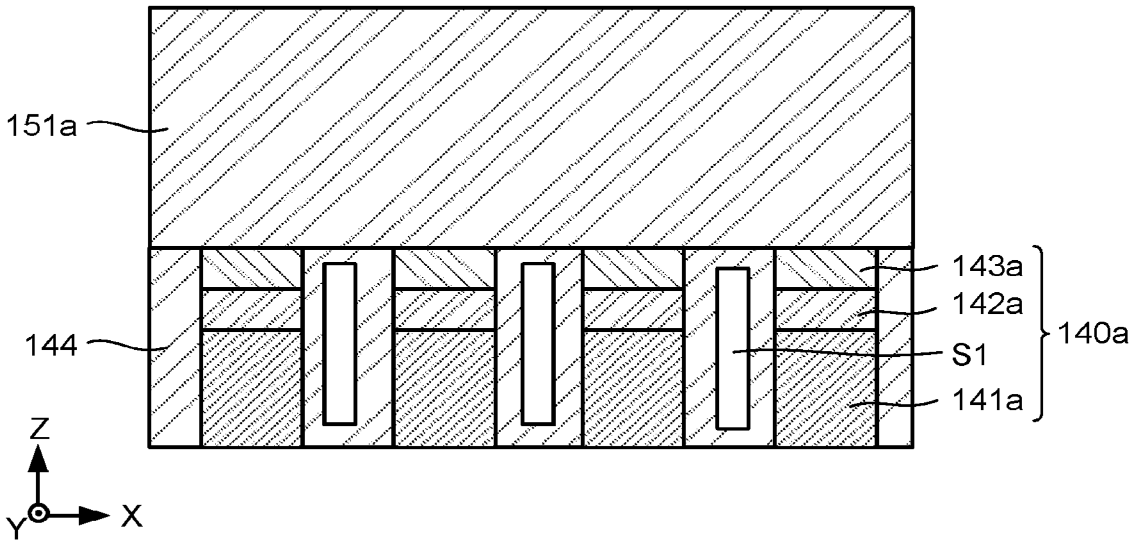
FIG. 6 is a cross-sectional schematic view for explaining a method embodiment of manufacturing the first structure embodiment.

As illustrated in FIG. 6, the insulating film (lower insulating layer) 151*a* is formed above the insulating layer 143*a* and the insulating layer 144. The insulating film 151*a* can be formed using CVD such as a low-pressure CVD method (LP-CVD) or a plasma CVD method (PE-CVD).

Figure 7:
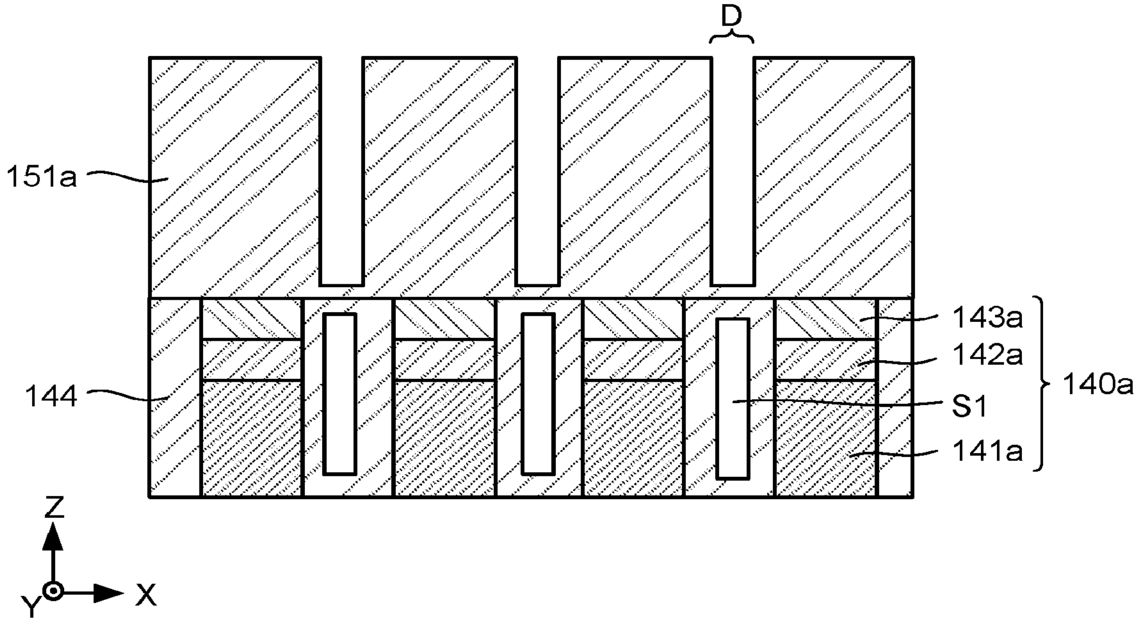
FIG. 7 is a cross-sectional schematic view for explaining the method embodiment of manufacturing the first structure embodiment.

Next, as illustrated in FIG. 7, the insulating film 151*a* is partially removed to form a depression. The insulating film 151*a* can be partially removed by forming a mask layer using, for example, the photolithography technique and performing etching such as dry etching or wet etching using the mask layer. The depression D is arbitrarily set according to the shape of the void S2 to be formed.

Figure 8:
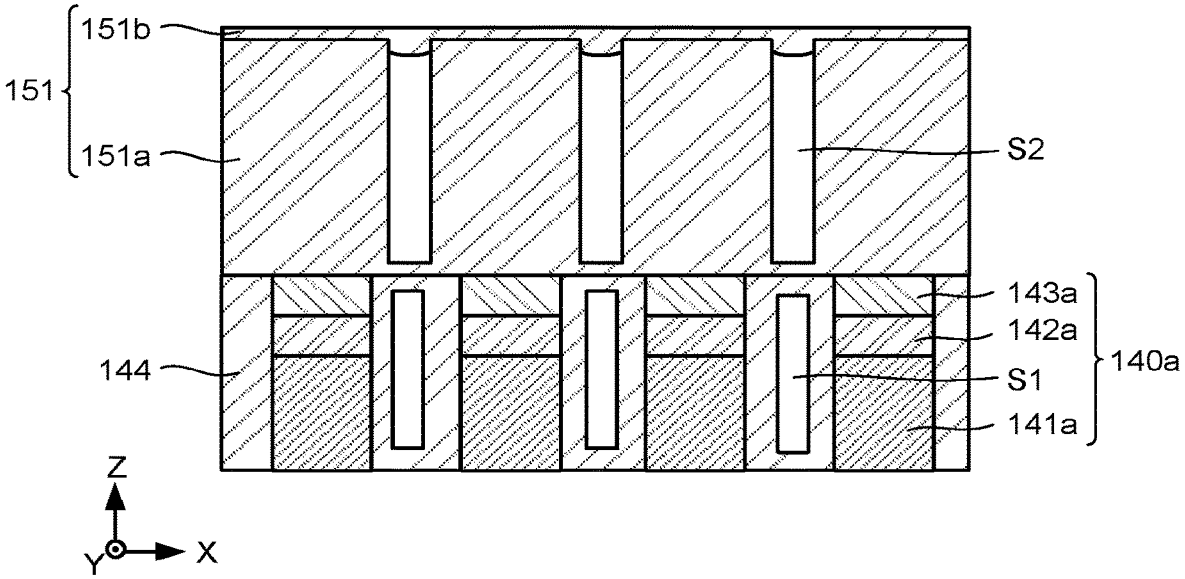
FIG. 8 is a cross-sectional schematic view for explaining the method embodiment of manufacturing the first structure embodiment.

Next, as illustrated in FIG. 8, an insulating film (upper insulating layer) 151*b* is formed on the insulating film 151*a* and the depression D, and the insulating film 151*b* is flattened. It is preferable that the insulating film 151*b* is worse in coverage (step covering property) than the insulating film 151*a*. This makes it possible to form the insulating film 151*b* without filling the depression D. Thus, the void S2 can be formed between the insulating film 151*a* and the insulating film 151*b*. The void S1 may be formed using a plurality of insulating films similarly to the void S2.

The insulating film 151*b* can be formed using CVD such as LP-CVD or PE-CVE. The insulating film 151*b* is flattened, for example, by reactive ion etching (RIE) or chemical mechanical polishing (CMP).

The stack of the insulating film 151*a* and the insulating film 151*b* forms the insulating layer 151. The interface between the insulating film 151*a* and the insulating film 151*b* is not always visible.

Figure 9:
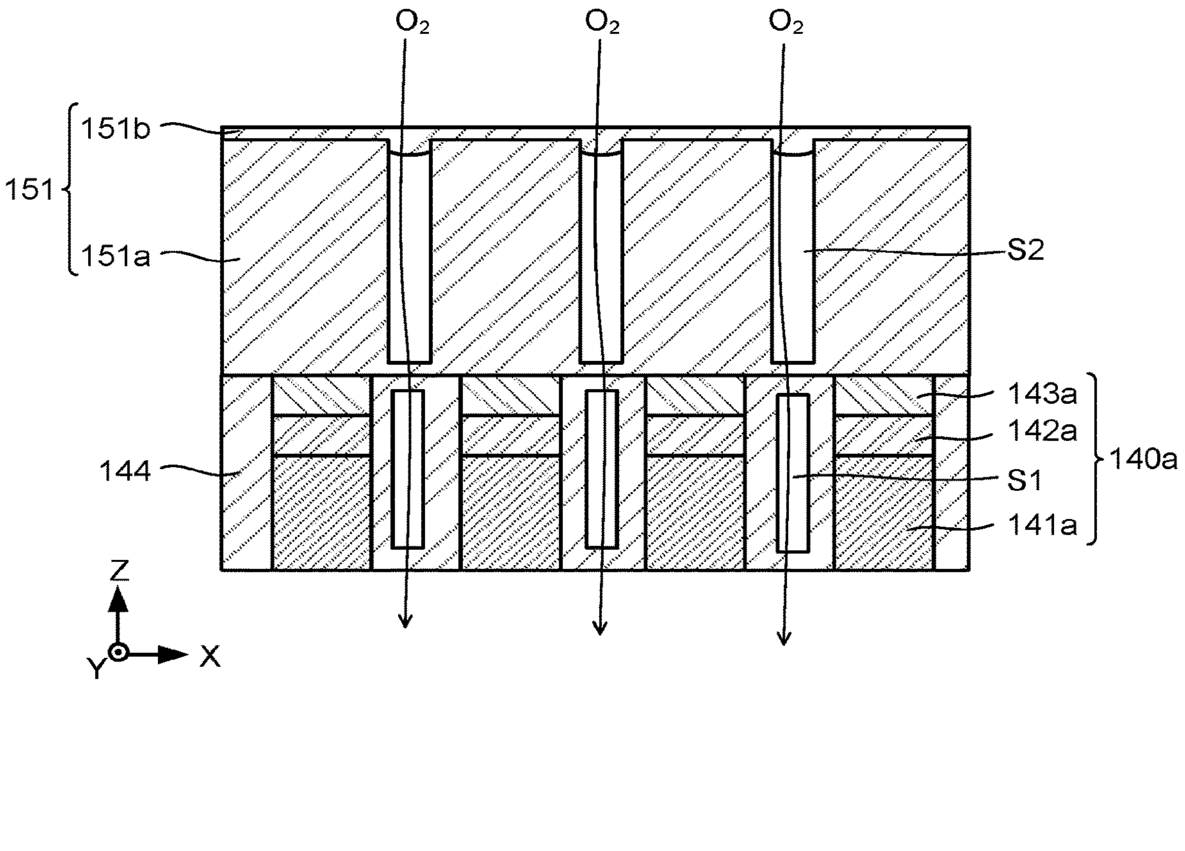
FIG. 9 is a cross-sectional schematic view for explaining the method embodiment of manufacturing the first structure embodiment.

Next, as illustrated in FIG. 9, by performing a heat treatment under an atmosphere containing oxygen, oxygen is supplied to the oxide semiconductor layer 121 through the void S1 and the void S2. For the forming methods of the other components, existing methods can be used. The above is the explanation of the method embodiment of manufacturing the first structure embodiment.

As explained above, the first structure embodiment includes the insulating layer 151 having the void S2 to enables easily supplying oxygen to the oxide semiconductor layer 121 by the heat treatment with oxygen even if the insulating layer 151 is thicker. This can prevent a decrease in reliability of the semiconductor device.

Further Embodiment of the First Structure Embodiment

Figure 10:
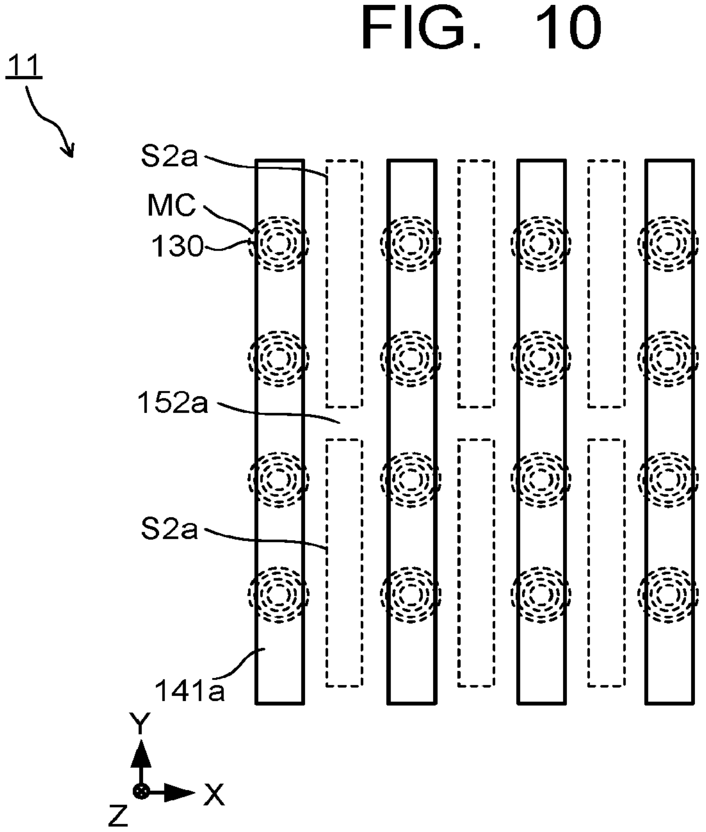
FIG. 10 is a planar schematic view for explaining a first further embodiment of the first structure embodiment.

FIG. 10 is a planar schematic view for explaining a first further embodiment of the first structure embodiment. FIG. 10 is a planar schematic view including the X-axis and the Y-axis. A memory cell array illustrated in FIG. 10 is different in that a region 152*a* which partitions the void S2 into a plurality of voids S2*a* is provided, as compared with the structure embodiment illustrated in FIG. 5. Hereinafter, parts different from those in FIG. 5 will be explained, and for the other parts, the explanation of FIG. 5 can be used as appropriate.

The region 152*a* is provided between the plurality of voids S2*a* along the Y-axis direction. The region 152*a* does not have the void S2 of the insulating layer 151. Therefore, the region 152*a* contains silicon and oxygen. The formation of the region 152*a*, the density (volume ratio) of the voids S2 in the region 101*a* including the memory cell array 11 illustrated in FIG. 1 can be adjusted. The density of the voids S2 is a ratio of the volume of the voids S2 to the volume of the insulating layer 151. When the density of the voids S2 is high, the shrinkage of the insulating layer 151 is more likely to occur. For this reason, the density of the voids S2 is adjusted in some cases.

Figure 11:
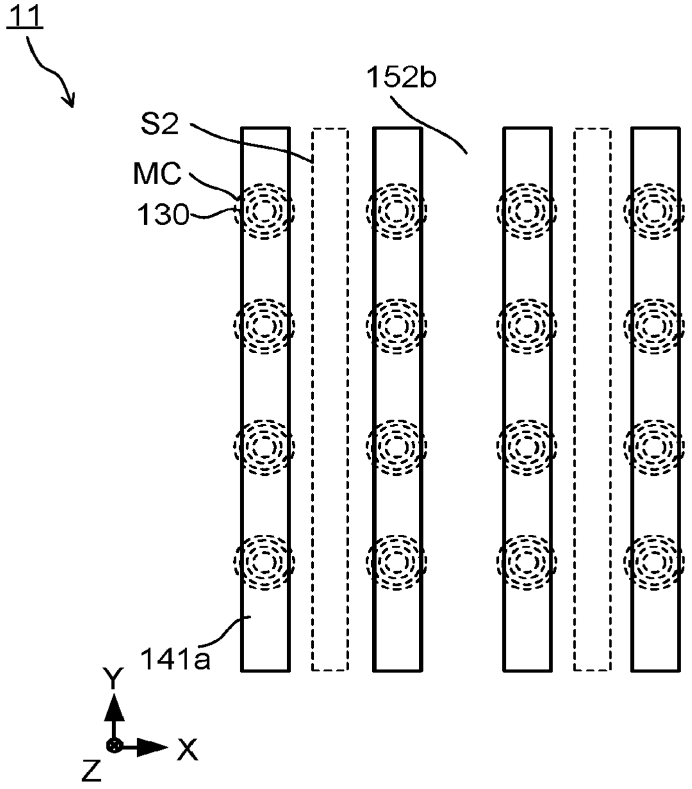
FIG. 11 is a planar schematic view for explaining a second further embodiment of the first structure embodiment.

FIG. 11 is a planar schematic view for explaining a second further embodiment of the first structure embodiment. FIG. 11 is a planar schematic view including the X-axis and the Y-axis. A memory cell array illustrated in FIG. 11 is different in that a region 152*b* is provided between the plurality of voids S2 arranged side by side in the X-axis direction, as compared with the structure embodiment illustrated in FIG. 5. Hereinafter, parts different from those in FIG. 5 will be explained, and for the other parts, the explanation of FIG. 5 can be used as appropriate.

The region 152*b* is provided between the plurality of voids S2 and between the plurality of conductive layers 141*a* in the X-axis direction. The region 152*b* does not have the void S2 of the insulating layer 151. Therefore, the region 152*b* contains silicon and oxygen. The formation of the region 152*b* enables adjusting the density (volume ratio) of the voids S2, for example, in the region 101*a* including the memory cell array 11 illustrated in FIG. 1.

In the first structure embodiment, the density (volume ratio) of the voids S2 in the region 101*a* including the memory cell array 11 illustrated in FIG. 1 is higher than the density (volume ratio) of the voids S2 in the region 101*b* including the peripheral circuit 12 illustrated in FIG. 1. For example, in the X-Y plane, a ratio of the area of the voids S2 to the area of the insulating layer 151 in the region 101*a* is greater than a ratio of the area of the voids S2 to the area of the insulating layer 151 in the region 101*b*. For example, in the X-Y plane, the number of voids S2 per unit area of the insulating layer 151 in the region 101*a* is larger than the number of voids S2 per unit area of the insulating layer 151 in the region 101*b*.

Second Structure Embodiment of the Memory Cell Array

Figure 12:
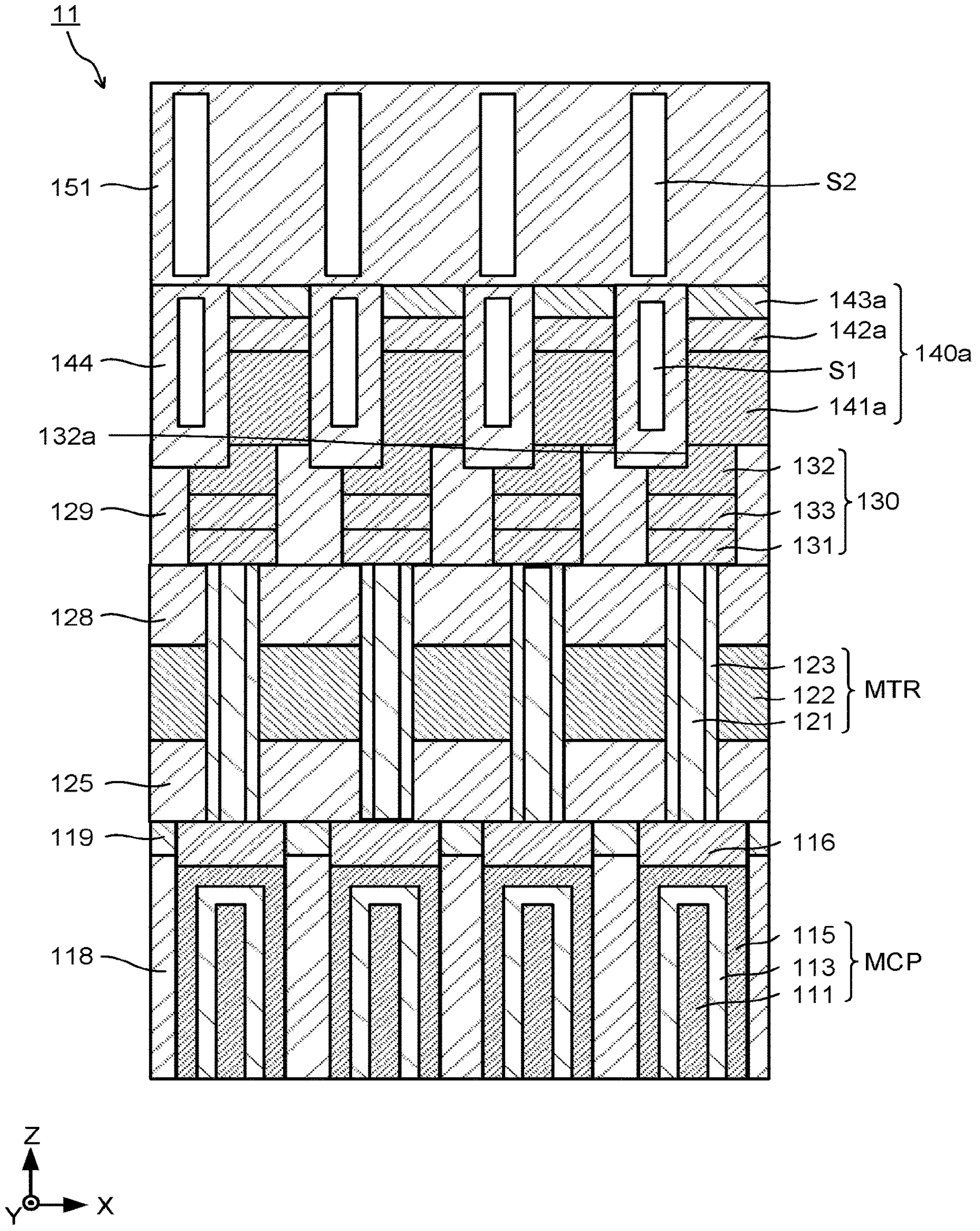
FIG. 12 is a cross-sectional schematic view for explaining a second structure embodiment of the memory cell array.
Figure 13:
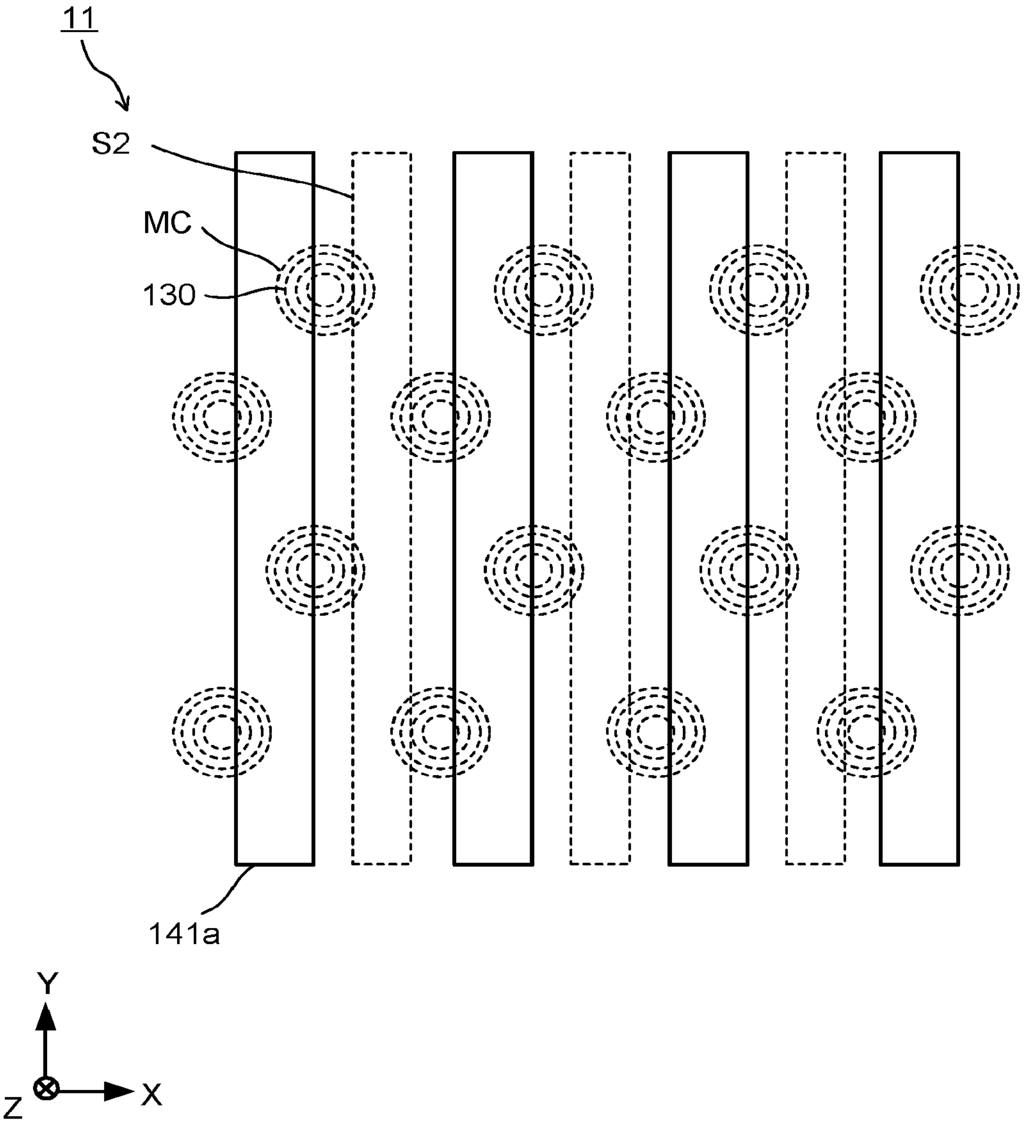
FIG. 13 is a planar schematic view for explaining the second structure embodiment of the memory cell array.

FIG. 12 is a cross-sectional schematic view for explaining a second structure embodiment of the memory cell array 11, and FIG. 13 is a planar schematic view for explaining the second structure embodiment of the memory cell array 11 and is a planar schematic view including the X-axis and the Y-axis.

The memory cell array 11 illustrated in FIG. 12 further includes a void S2 provided in the insulating layer 151 as in the first structure embodiment.

The void S2 has a size much larger than a vacancy (pore) generated in the insulating layer 151, for example, during the formation of the insulating layer 151. The void S2 is provided above the void S1. The void S2 may be filled with, for example, air. The formation of the void S2 at the position overlapping the void S1 enables increasing the supply efficiency of oxygen into the oxide semiconductor layer 121. Hereinafter, parts different from those in the first structure embodiment will be explained, and for the other parts, the explanation of the first structure embodiment can be used as appropriate.

A plurality of memory cells MC form a staggered arrangement in the X-Y plane as illustrated in FIG. 13. A plurality of memory cells MC are arranged side by side in the X-axis direction to form one row. A plurality of memory cells MC that are adjacent to the one row in the Y-axis direction and arranged side by side in the X-axis direction are arranged shifted in the X-axis direction with respect to the memory cells MC in the one row. This can increase the degree of integration of the memory cells MC. The number of memory cells MC is not particularly limited.

A conductive layer 132 illustrated in FIG. 12 has a cutout surface 132*a*. For example, the length in the X-axis direction at an upper portion of the conductive layer 132 is shorter than the length in the X-axis direction at a lower portion of the conductive layer 132. For example, the length in the Y-axis direction at the upper portion of the conductive layer 132 is shorter than the length in the Y-axis direction at the lower portion of the conductive layer 132. The formation of the cutout surface 132*a* enables widening a supply path for oxygen to the oxide semiconductor layer 121, thereby facilitating the supply of oxygen to the oxide semiconductor layer 121 through the void S1 and the void S2. For example, the cutout surface 132*a*, which enables increasing the length in the X-axis direction of the insulating layer 144 and decreasing the distance from the void S1 to the oxide semiconductor layer 121, can be formed by partially removing the conductive layer 132 by etching using, for example, the stack 140*a* as the mask layer.

In the second structure embodiment, the insulating layer 151 having the void S2 is provided and the heat treatment containing oxygen is performed, thereby making it easy to supply oxygen to the oxide semiconductor layer 121 even if the insulating layer 151 is thick. This can prevent a decrease in reliability of the semiconductor device. The void S2 can be formed by the same method as that in the first structure embodiment.

Further Embodiment of the Second Structure Embodiment

Figure 14:
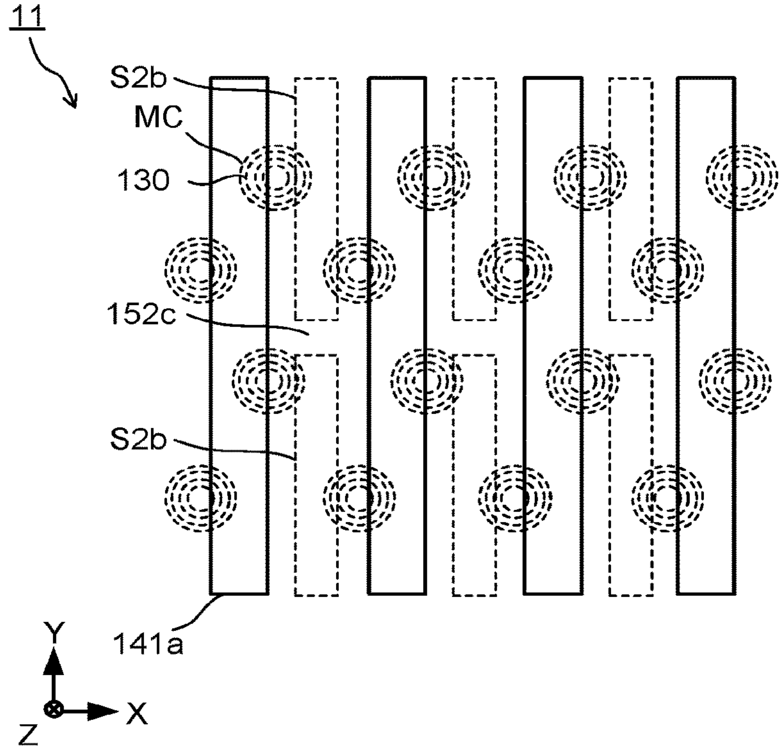
FIG. 14 is a planar schematic view for explaining a first further embodiment of the second structure embodiment of the memory cell array.

FIG. 14 is a planar schematic view for explaining a first further embodiment of the second structure embodiment. FIG. 14 is a planar schematic view including the X-axis and the Y-axis. A memory cell array illustrated in FIG. 14 is different in that a region 152*c* which partitions the void S2 into a plurality of voids S2*b* is provided, as compared with the structure embodiment illustrated in FIG. 12 and FIG. 13. Hereinafter, parts different from those in FIG. 12 and FIG. 13 will be explained, and for the other parts, the explanation of FIG. 12 and FIG. 13 can be used as appropriate.

The region 152*c* is provided between the plurality of voids S2*b* along the Y-axis direction. The region 152*c* does not have the void S2 of the insulating layer 151. Therefore, the region 152*c* contains silicon and oxygen. The formation of region 152*c* enables adjusting the density (volume ratio) of the voids S2, for example, in the region 101*a* including the memory cell array 11 illustrated in FIG. 1.

Figure 15:
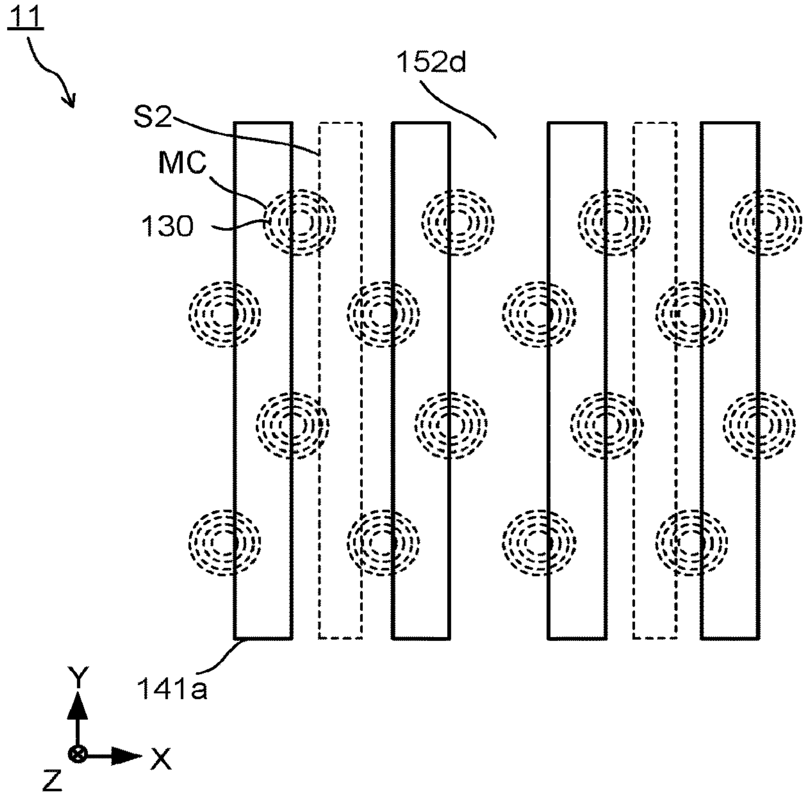
FIG. 15 is a planar schematic view for explaining a second further embodiment of the second structure embodiment of the memory cell array.

FIG. 15 is a planar schematic view for explaining a second further embodiment of the second structure embodiment. FIG. 15 is a planar schematic view including the X-axis and the Y-axis. A memory cell array illustrated in FIG. 15 is different in that a region 152*d* is provided between the plurality of voids S2, as compared with the structure embodiment illustrated in FIG. 12 and FIG. 13. Hereinafter, parts different from those in FIG. 12 and FIG. 13 will be explained, and for the other parts, the explanation of FIG. 12 and FIG. 13 can be used as appropriate.

The region 152*d* is provided between the plurality of voids S2*b* and between the plurality of conductive layers 141*a* in the X-axis direction. The region 152*d* does not have the void S2 of the insulating layer 151. Therefore, the region 152*d* contains silicon and oxygen. The formation of the region 152*d* enables adjusting the density (volume ratio) of the voids S2, for example, in the region 101*a* including the memory cell array 11 illustrated in FIG. 1.

In the second structure embodiment of the memory cell array 11, the density (volume ratio) of the voids S2 in the region 101*a* illustrated in FIG. 1 is higher than the density (volume ratio) of the voids S2 in the region 101*b* illustrated in FIG. 1.

Third Structure Embodiment of the Memory Cell Array

Figure 16:
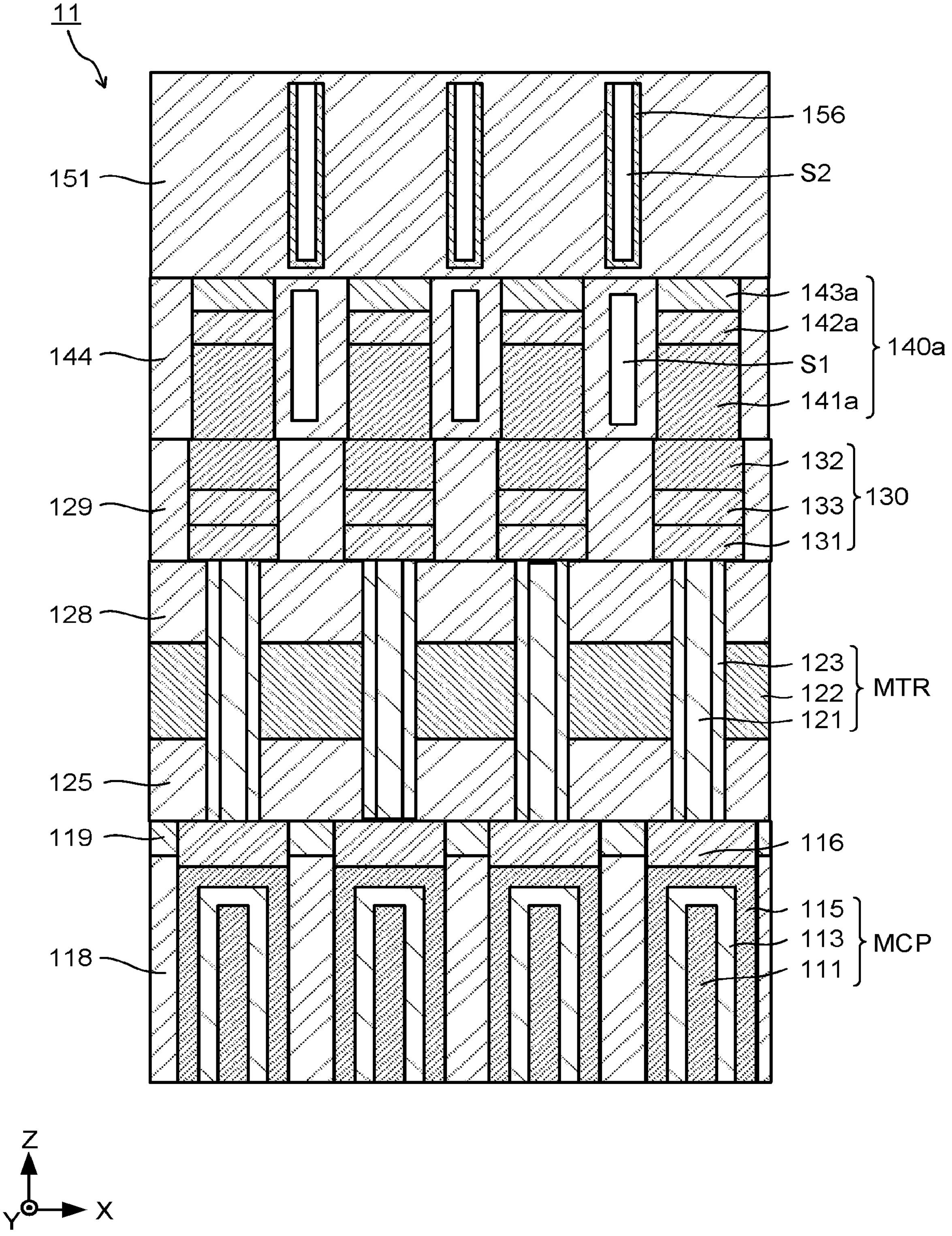
FIG. 16 is a cross-sectional schematic view for explaining a third structure embodiment of the memory cell array.
Figure 17:
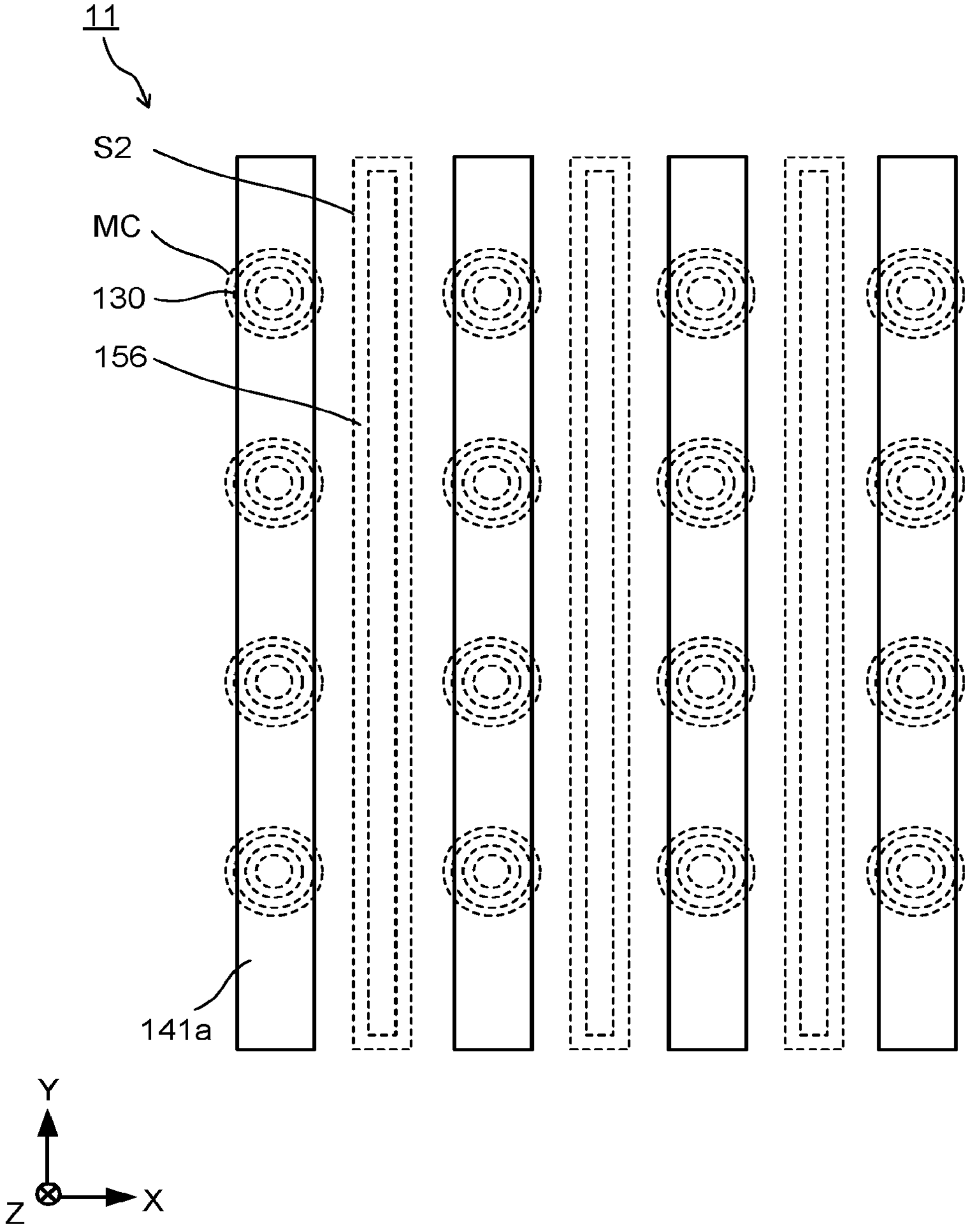
FIG. 17 is a planar schematic view for explaining the third structure embodiment of the memory cell array.

FIG. 16 is a cross-sectional schematic view for explaining a third structure embodiment of the memory cell array 11 and is a cross-sectional schematic view including the X-axis and the Z-axis. FIG. 17 is a planar schematic view for explaining the third structure embodiment of the memory cell array 11 and is a planar schematic view including the X-axis and the Y-axis.

The third structure embodiment of the memory cell array 11 further includes a void S2 provided in the insulating layer 151 as in the first structure embodiment, and a film 156 provided in the void S2. Hereinafter, parts different from those in the first structure embodiment will be explained, and for the other parts, the explanation of the first structure embodiment can be used as appropriate.

The film 156 is provided on at least a part of the inner surface of the void S2. The film 156 illustrated in FIG. 16 is provided on each of the inner side surface and the inner bottom surface of the void S2, but may be provided on one of the inner side surface and the inner bottom surface and does not have to be provided on the other for instance. The film 156 illustrated in FIG. 17 is provided continuously to the inner side surface and the inner bottom surface of the void S2, but may have a discontinuous portion. For example, the film 156 may be in contact with, for example, only a part of the inner side surface of the void S2.

The film 156 contains a metal capable of occluding hydrogen. The film 156 can permeate oxygen. The film 156 contains, for example, at least one metal element selected from the group consisting of titanium, tantalum, hafnium, lanthanum, and zirconium. The film 156 may contain oxygen element or nitrogen element in addition to the at least one metal element. For example, the film 156 is oxide, nitride or oxynitride of the at least one metal element. For example, the nitride is more preferable as a material of the film 156 because the nitride is more likely to occlude hydrogen than the oxide. The film 156 may be a multilayer film. Examples of the multilayer film include a stacked film of a metal film such as a titanium film and a metal nitride film such as a titanium nitride film.

The film 156 may further have a film (hydrogen barrier film) capable of blocking hydrogen. The hydrogen barrier film is stacked on a film containing the at least one metal element and oxygen or nitrogen, for example. Examples of the hydrogen barrier film include a silicon nitride film.

Method Embodiment of Manufacturing the Third Structure Embodiment

A method embodiment of manufacturing the third structure embodiment will be explained with reference to FIG. 18, FIG. 19, FIG. 20 and FIG. 21. FIG. 18 to FIG. 21 are cross-sectional schematic views for explaining the method embodiment of manufacturing the third structure embodiment. FIG. 18 to FIG. 21 illustrate a cross section including the X-axis and the Z-axis. Here, manufacturing steps from the formation of the insulating film 151*a* to the performance of the heat treatment will be explained. Parts different from those in the method embodiment of manufacturing the first structure embodiment will be explained below, and for the other parts, the explanation of the method embodiment of manufacturing the first structure embodiment can be used as appropriate.

First, as in the method embodiment of manufacturing the first structure embodiment, the insulating film (lower insulating layer) 151*a* is formed above the insulating layer 143*a* and the insulating layer 144, and the insulating film 151*a* is partially removed to form a depression D.

Figure 18:
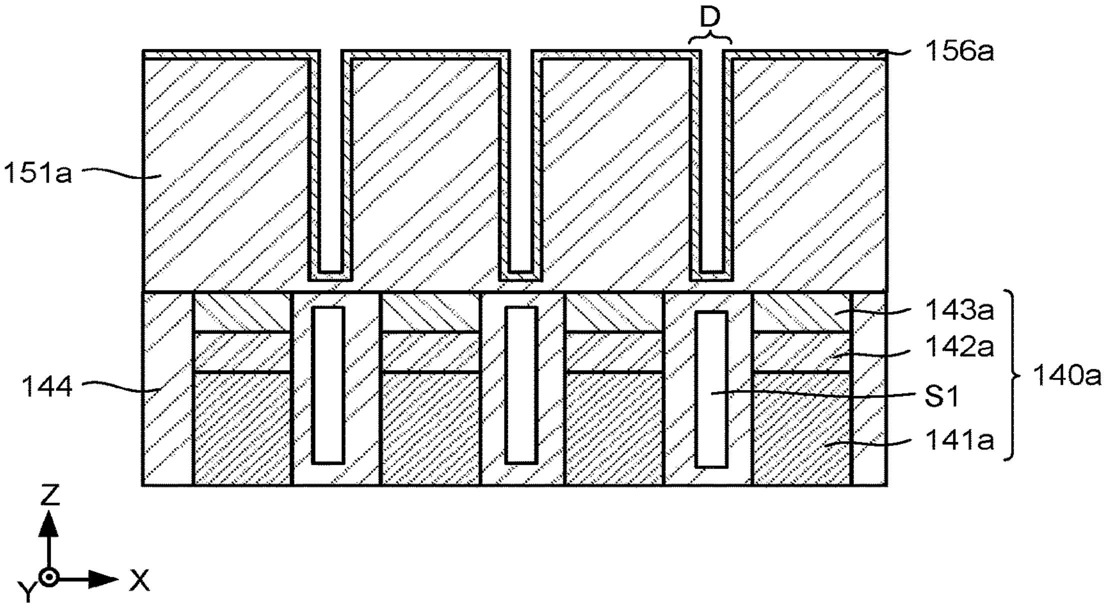
FIG. 18 is a cross-sectional schematic view for explaining a method embodiment of manufacturing the third structure embodiment.

Next, as illustrated in FIG. 18, a film 156*a* is formed. The film 156*a* can be formed using, for example, CVD, sputtering, or an atomic layer deposition method (AMD). The film 156*a* is formed in contact with not only the inner surface of the depression D but also the upper surface of the insulating film 151*a*.

Figure 19:
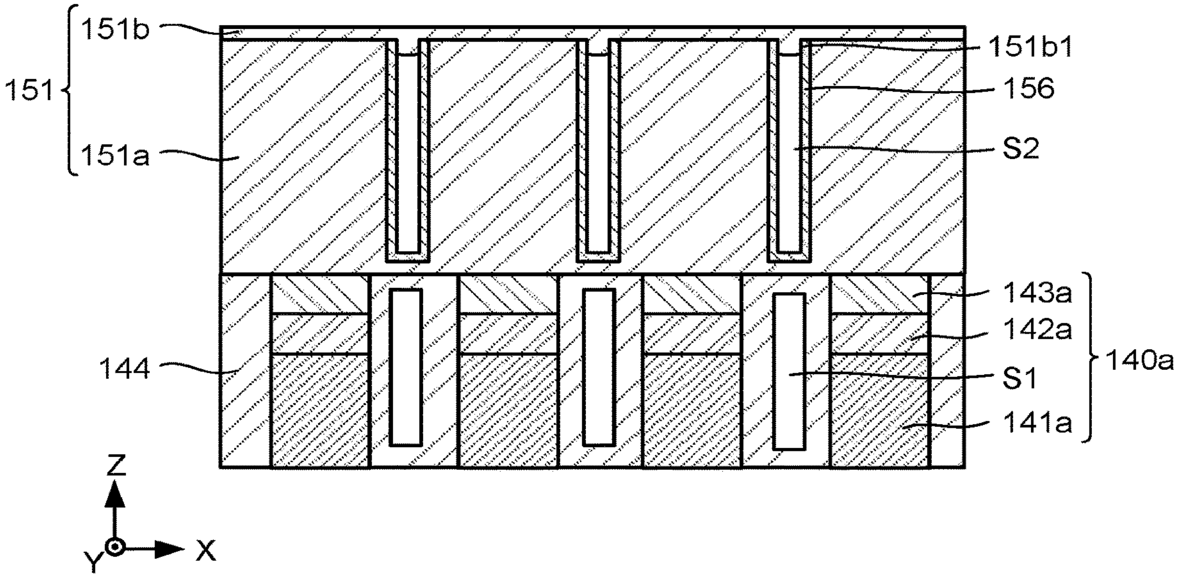
FIG. 19 is a cross-sectional schematic view for explaining the method embodiment of manufacturing the third structure embodiment.

Next, the film 156*a* is partially removed in the thickness direction to expose the upper surface of the insulating film 151*a* and separate the film 156*a* for each depression D to thereby form the film 156. Next, as illustrated in FIG. 19, as in the method embodiment of manufacturing the first structure embodiment, an insulating film 151*b* is formed on the insulating film 151*a* and the depression D, and the insulating film 151*b* is flattened. It is preferable that the insulating film 151*b* is worse in coverage (step covering property) than the insulating film 151*a*. This makes it possible to form the insulating film 151*b* without filling the depression D. Thus, the void S2 can be formed between the insulating film 151*a* and the insulating film 151*b*. The void S1 may be formed using a plurality of insulating films similarly to the void S2.

A part of the insulating film 151*b* may have a projecting part 151*b*1 projecting downward in a manner to enter the depression D as illustrated in FIG. 19. A part (upper end portion) of the film 156 is provided between the insulating film 151*a* and the insulating film 151*b* in the X-axis direction or the Y-axis direction.

The stack of the insulating film 151*a* and the insulating film 151*b* forms the insulating layer 151. The interface between the insulating film 151*a* and the insulating film 151*b* is not always visible.

Figure 20:
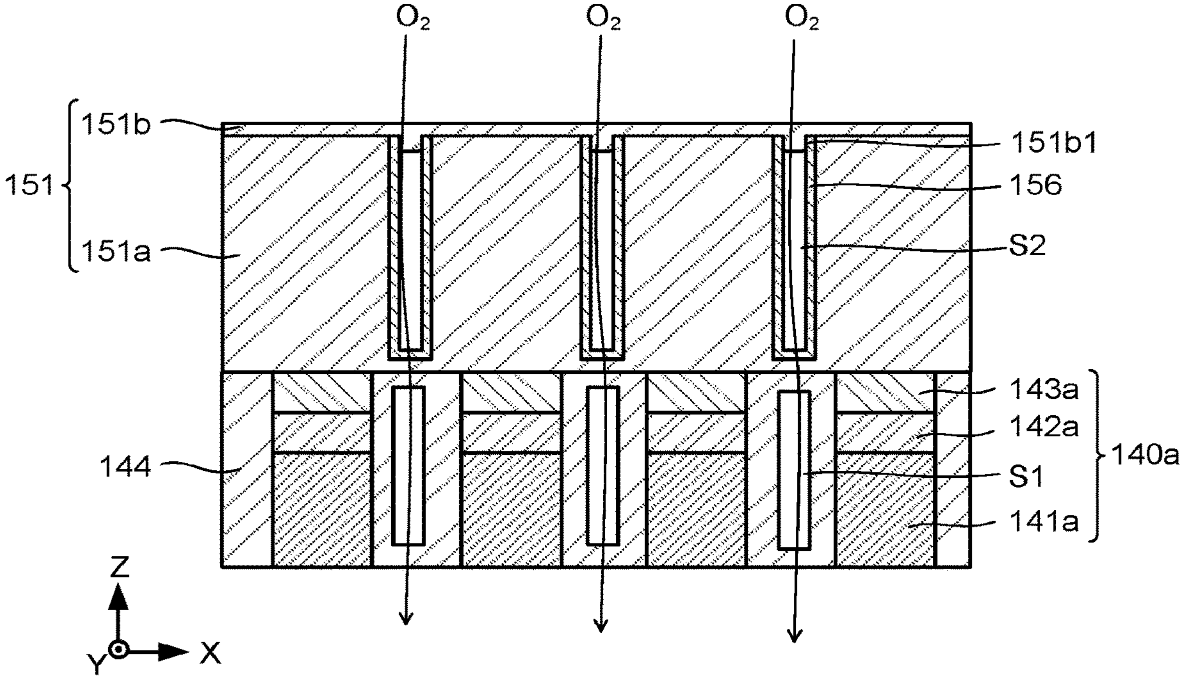
FIG. 20 is a cross-sectional schematic view for explaining the method embodiment of manufacturing the third structure embodiment.

Next, as illustrated in FIG. 20, a heat treatment under an atmosphere containing oxygen is performed to supply oxygen into the oxide semiconductor layer 121 through the void S1, the void S2, and the film 156. The methods of forming the other components can apply commonly methods.

In manufacture of the semiconductor device, for example, a heat treatment (hydrogen sinter treatment) under an atmosphere containing hydrogen is performed after the formation of a layer constituting the memory cells MC. This heat treatment enables terminating the dangling bond existing, for example, in the interface between the semiconductor substrate 101 and the gate insulating film of the field-effect transistor 102 with hydrogen so as to reduce the interface state density between the semiconductor substrate 101 and the gate insulating film of the field-effect transistor 102. The heat treatment is performed, for example, for 10 minutes or more and 60 minutes or less under a gas atmosphere containing nitrogen and hydrogen. In this event, if hydrogen enter into the oxide semiconductor layer 121, for example, the threshold voltage of the memory transistor MTR shifts to a negative direction. This causes a decrease in reliability of the semiconductor device.

Figure 21:
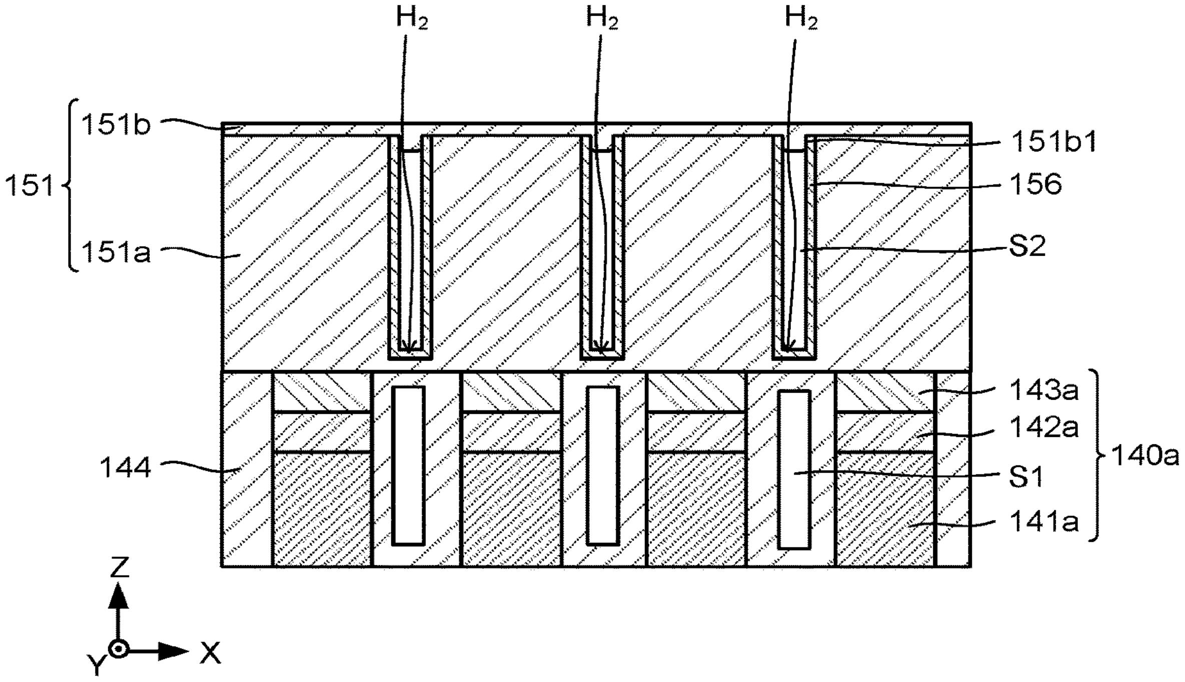
FIG. 21 is a cross-sectional schematic view for explaining the method embodiment of manufacturing the third structure embodiment.

In contrast to the above, the third structure embodiment has the film 156 capable of occluding hydrogen in the void S2, so that even when the heat treatment is performed under an atmosphere containing hydrogen, the entrance of hydrogen into the oxide semiconductor layer 121 can be prevented because the film 156 can occlude hydrogen as illustrated in FIG. 21. This can prevent a decrease in reliability of the semiconductor device.

The formation of the film 156 in the void S2 enables providing the film 156 with respect to, for example, one or more memory cells, to efficiently prevent hydrogen to enter into the oxide semiconductor layer 121 in each memory cell MC. Further, the formation of the film 156 on each of the inner bottom surface and the inner side surface of the void S2 enables increasing the area of the film 156 without increasing the area of the memory cell MC in the X-Y plane. The increase in area of the film 156 can facilitate occlusion of hydrogen.

Further Embodiment of the Third Structure Embodiment

Figure 22:
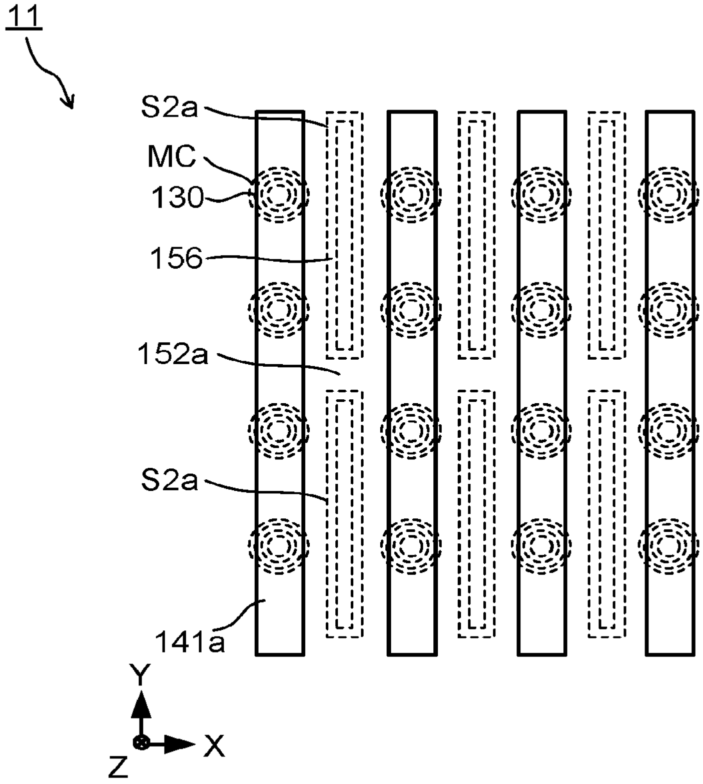
FIG. 22 is a planar schematic view for explaining a first further embodiment of the third structure embodiment.

FIG. 22 is a planar schematic view for explaining a first further embodiment of the third structure embodiment. FIG. 22 is a planar schematic view including the X-axis and the Y-axis. A memory cell array illustrated in FIG. 22 is different in that a region 152*a* which partitions the void S2 into a plurality of voids S2*a* is provided, as compared with the structure embodiment illustrated in FIG. 17. Hereinafter, parts different from those in FIG. 17 will be explained, and for the other parts, the explanation of FIG. 17 can be used as appropriate.

The region 152*a* is provided between the plurality of voids S2*a* and the plurality of films 156 along the Y-axis direction. The region 152*a* does not have the void S2 nor the film 156 of the insulating layer 151. Therefore, the region 152*a* contains silicon and oxygen. The formation of the region 152*a* enables adjusting the density (volume ratio) of the voids S2 in the region 101*a* including the memory cell array 11 illustrated in FIG. 1. For the other explanation of the region 152*a*, the explanation of the region 152*a* in the first further embodiment of the first structure embodiment can be used as appropriate.

Figure 23:
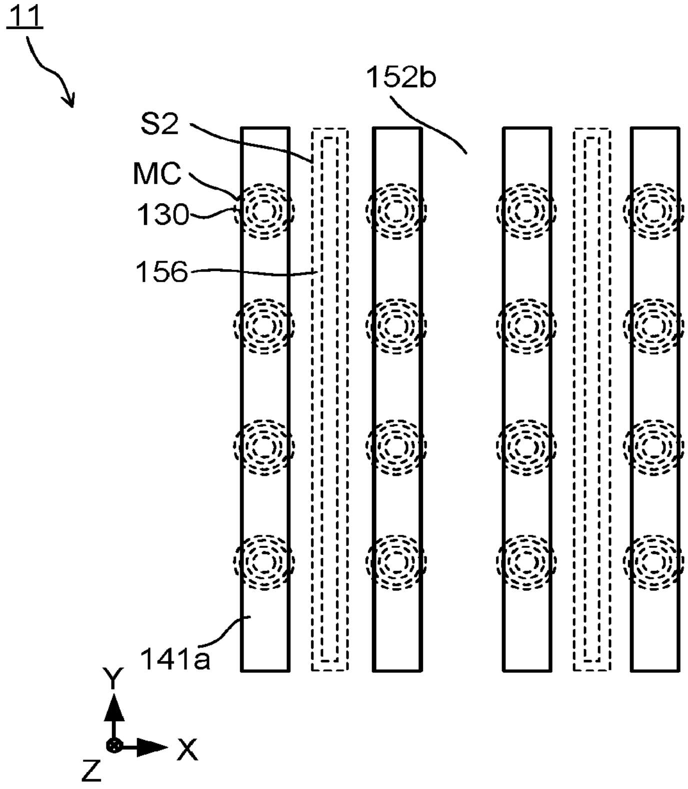
FIG. 23 is a planar schematic view for explaining a second further embodiment of the third structure embodiment.

FIG. 23 is a planar schematic view for explaining a second further embodiment of the third structure embodiment. FIG. 23 is a planar schematic view including the X-axis and the Y-axis. A memory cell array illustrated in FIG. 23 is different in that a region 152*b* is provided between a plurality of the voids S2 arranged side by side in the X-axis direction, as compared with the structure embodiment illustrated in FIG. 17. Hereinafter, parts different from those in FIG. 17 will be explained, and for the other parts, the explanation of FIG. 17 can be used as appropriate.

The region 152*b* is provided between the plurality of the voids S2 and between the plurality of films 156, and between the plurality of conductive layers 141*a* in the X-axis direction. The region 152*b* does not have the void S2 nor the film 156. Therefore, the region 152*b* contains silicon and oxygen. For the other explanation of the region 152*b*, the explanation of the region 152*b* in the second further embodiment of the first structure embodiment can be used as appropriate.

Fourth Structure Embodiment of the Memory Cell Array

Figure 24:
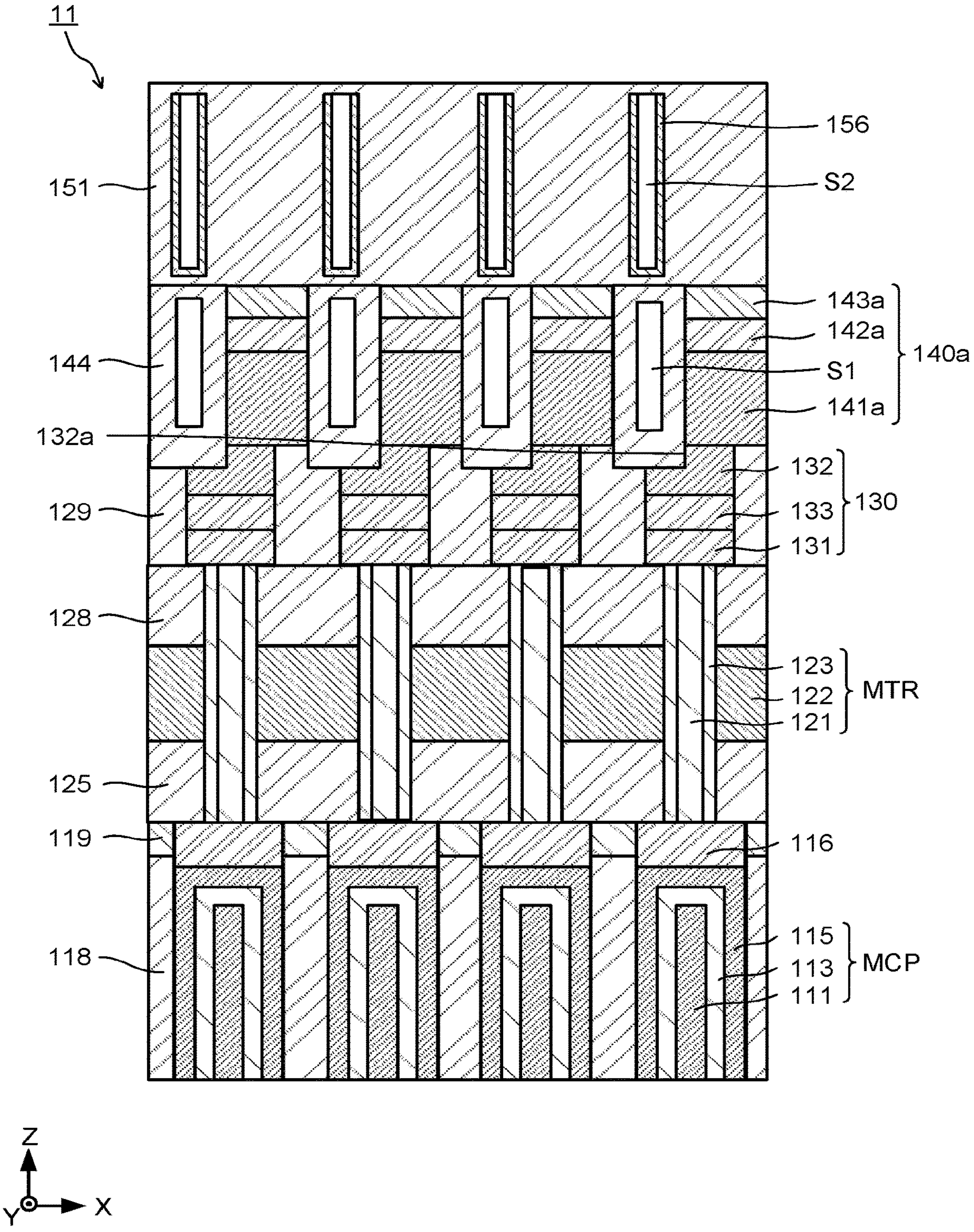
FIG. 24 is a cross-sectional schematic view for explaining a fourth structure embodiment of the memory cell array.
Figure 25:
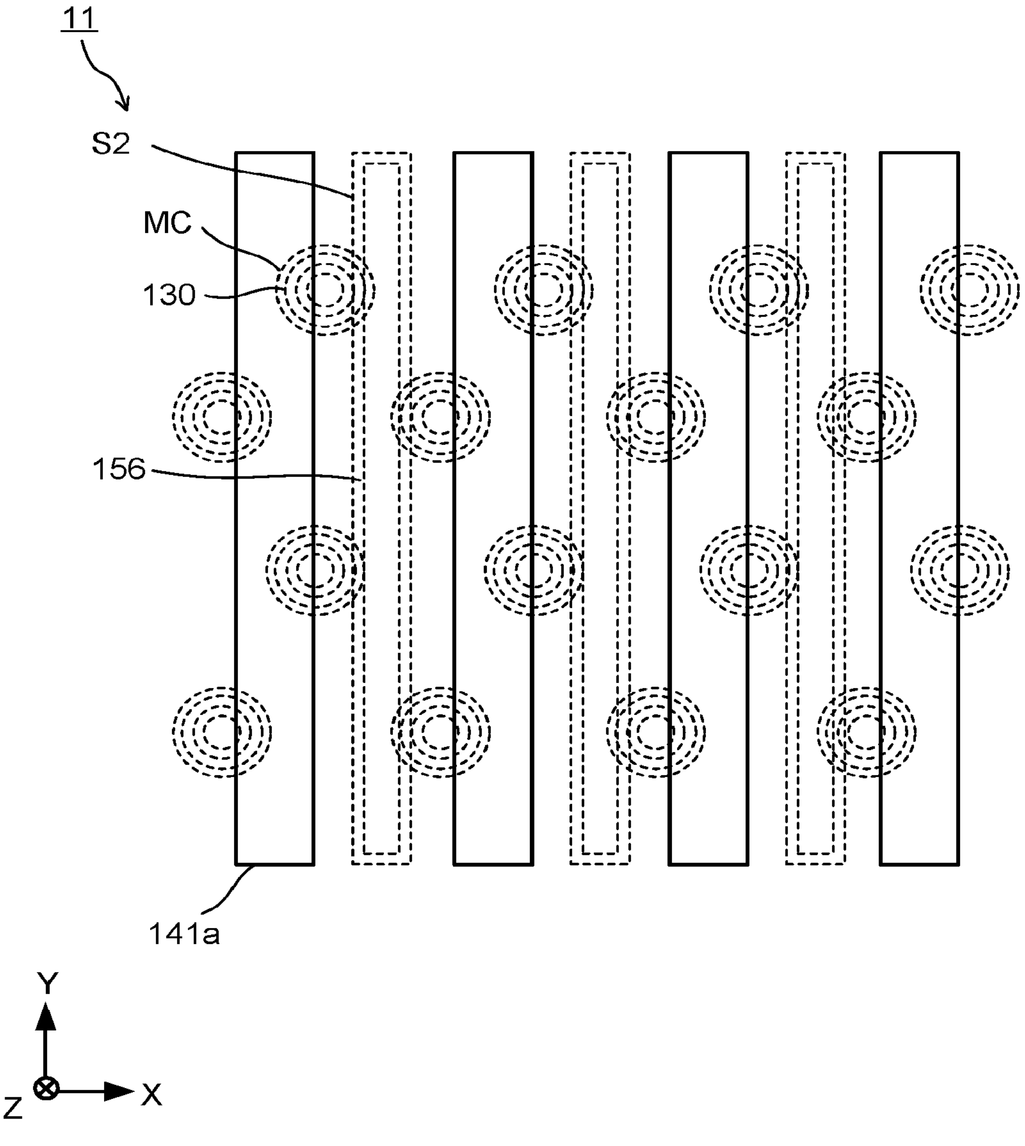
FIG. 25 is a planar schematic view for explaining the fourth structure embodiment of the memory cell array.

FIG. 24 is a cross-sectional schematic view for explaining a fourth structure embodiment of the memory cell array 11 and is a cross-sectional schematic view including the X-axis and the Z-axis. FIG. 25 is a planar schematic view for explaining the fourth structure embodiment of the memory cell array 11 and is a planar schematic view including the X-axis and the Y-axis.

The fourth structure embodiment of the memory cell array 11 further includes a void S2 provided in the insulating layer 151 and a film 156 provided in the void S2, as in the third structure embodiment. Hereinafter, parts different from those in the third structure embodiment will be explained, and for the other parts, the explanation of the third structure embodiment can be used as appropriate.

A plurality of the memory cells MC form a staggered arrangement in the X-Y plane as illustrated in FIG. 25. A plurality of the memory cells MC are arranged side by side in the X-axis direction to form one row. A plurality of the memory cells MC that are adjacent to the one row in the Y-axis direction and arranged side by side in the X-axis direction are arranged shifted in the X-axis direction with respect to the memory cells MC in the one row. This can increase the degree of integration of the memory cells MC. The number of memory cells MC is not particularly limited.

A conductive layer 132 illustrated in FIG. 24 has a cutout surface 132*a*. For the other explanation of the cutout surface 132*a*, the explanation of the cutout surface 132*a* in the second further embodiment can be used as appropriate.

The fourth structure embodiment has, as in the third structure embodiment, the film 156 capable of occluding hydrogen in the void S2 to enables occlude hydrogen into the film 156 even if the heat treatment is performed under an atmosphere containing hydrogen, and thus prevents hydrogen to enter into the oxide semiconductor layer 121. This can prevent a decrease in reliability of the semiconductor device.

Further Embodiment of the Fourth Structure Embodiment

Figure 26:
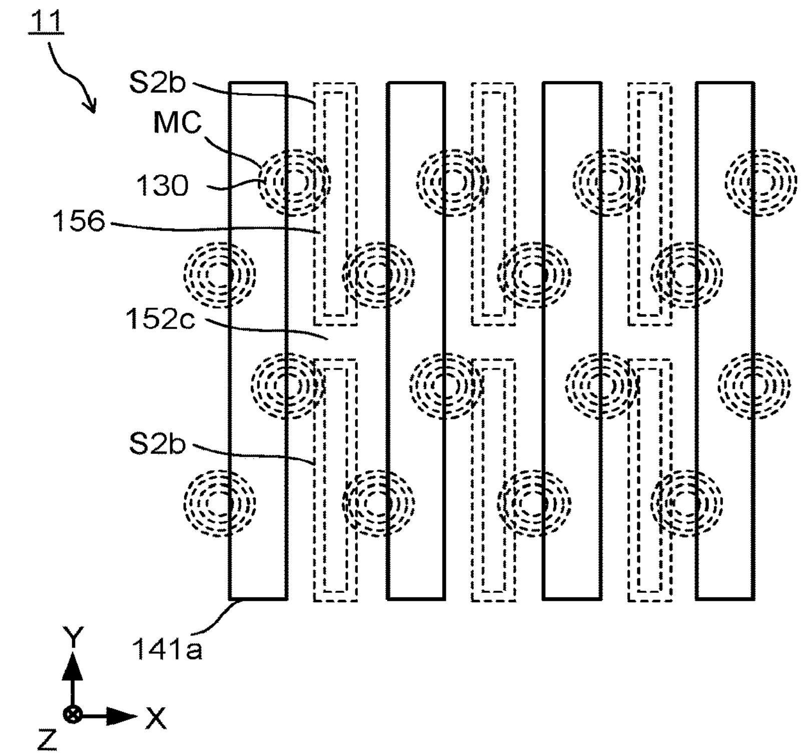
FIG. 26 is a planar schematic view for explaining a first further embodiment of the fourth structure embodiment of the memory cell array.

FIG. 26 is a planar schematic view for explaining a first further embodiment of the fourth structure embodiment. FIG. 26 is a planar schematic view including the X-axis and the Y-axis. A memory cell array illustrated in FIG. 26 is different in that a region 152*c* which partitions the void S2 into a plurality of voids S2*b* is provided, as compared with the structure embodiment illustrated in FIG. 24 and FIG. 25. Hereinafter, parts different from those in FIG. 24 and FIG. 25 will be explained, and for the other parts, the explanation of FIG. 24 and FIG. 25 can be used as appropriate.

The region 152*c* is provided between the plurality of voids S2*b* and the plurality of films 156 along the Y-axis direction. The region 152*c* does not have the void S2 nor the film 156 of the insulating layer 151. Therefore, the region 152*c* contains silicon and oxygen. The formation of the region 152*c* enables adjusting the density (volume ratio) of the voids S2, for example, in the region 101*a* including the memory cell array 11 illustrated in FIG. 1. For the other explanation of the region 152*c*, the explanation of the region 152*c* in the first further embodiment of the second structure embodiment can be used as appropriate.

Figure 27:
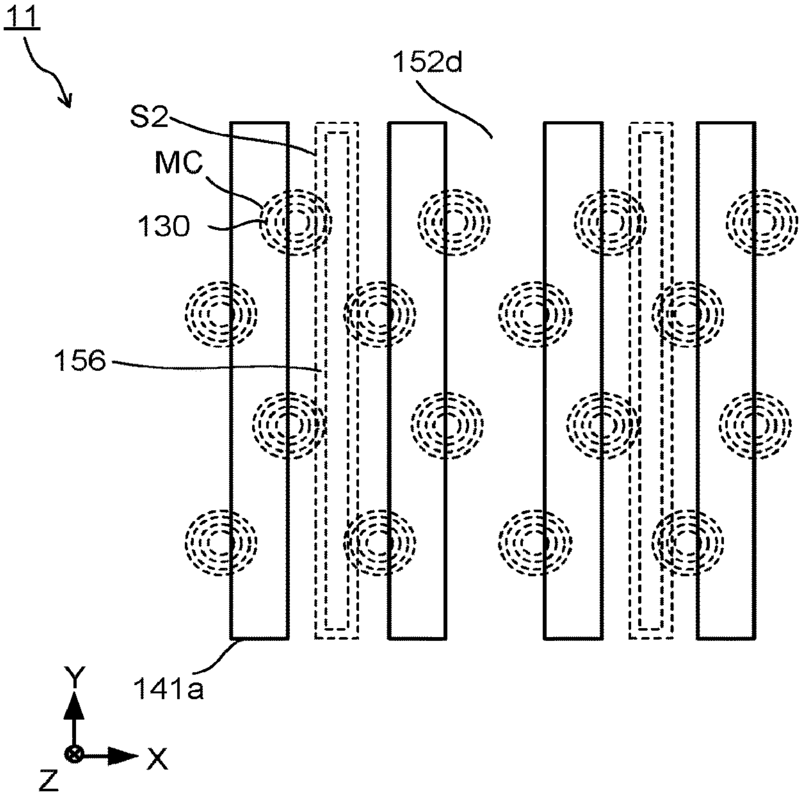
FIG. 27 is a planar schematic view for explaining a second further embodiment of the fourth structure embodiment of the memory cell array.

FIG. 27 is a planar schematic view for explaining a second further embodiment of the fourth structure embodiment. FIG. 27 is a planar schematic view including the X-axis and the Y-axis. A memory cell array illustrated in FIG. 27 is different in that a region 152*d* is provided between a plurality of voids S2, as compared with the structure embodiment illustrated in FIG. 24 and FIG. 25. Hereinafter, parts different from those in FIG. 24 and FIG. 25 will be explained, and for the other parts, the explanation of FIG. 24 and FIG. 25 can be used as appropriate.

The region 152*d* is provided between the plurality of voids S2 and between the plurality of films 156, and between the plurality of conductive layers 141*a* in the X-axis direction. The region 152*d* does not have the void S2 of the insulating layer 151. Therefore, the region 152*d* contains silicon and oxygen. For the other explanation of the region 152*d*, the explanation of the region 152*d* in the second further embodiment of the second structure embodiment can be used as appropriate.

While certain embodiments of the present invention have been described, these embodiments have been presented by way of example only, and are not intended to limit the scope of the inventions. These novel embodiments described herein may be embodied in a variety of other forms; furthermore, various omissions, substitutions and changes may be made therein without departing from the spirit of the inventions. The accompanying claims and their equivalents are intended to cover such forms or modifications as would fall within the scope and spirit of the inventions.

What is claimed is:

1. A semiconductor device comprising:
- a first conductor;
- a second conductor;
- an oxide semiconductor layer provided between the first conductor and the second conductor and extending in a first direction;
- a first wiring extending in a second direction across the first direction and surrounding the oxide semiconductor layer;
- an insulating film provided between the first wiring and the oxide semiconductor layer;
- a second wiring provided on the second conductor and extending in a third direction across each of the first and second directions;
- a first insulating layer provided on a side surface of the second wiring and having a first void; and
- a second insulating layer provided on the first insulating layer and having a second void,
- wherein the oxide semiconductor layer has two ends in the first direction,
- one end of the oxide semiconductor is directly connected to the first conductor, and
- another end of the oxide semiconductor is directly connected to the second conductor.

2. The semiconductor device according to claim 1, wherein
- the first void and the second void at least partially overlap with each other in a plane having the second and third directions.

3. The semiconductor device according to claim 1, wherein
- the second conductor is provided on the oxide semiconductor layer and includes a conductive oxide layer containing a metal oxide.

4. The semiconductor device according to claim 1, wherein
- the second void extends along the third direction.

5. The semiconductor device according to claim 1, wherein
- the second insulating layer has a plurality of the second voids provided along the third direction.

6. The semiconductor device according to claim 1, further comprising
- a film provided on an inner surface of the second void, wherein
- the film contains at least one metal element selected from the group consisting of titanium, tantalum, hafnium, lanthanum, and zirconium, and oxygen or nitrogen.

7. The semiconductor device according to claim 6, wherein
- the film contains oxide or nitride of at least one metal selected from the group consisting of titanium, tantalum, hafnium, lanthanum, and zirconium.

8. The semiconductor device according to claim 6, wherein
- the film is configured to occlude hydrogen and permeate oxygen.

9. The semiconductor device according to claim 6, further comprising
- a silicon nitride film provided on the film.

10. A method for manufacturing a semiconductor device, the method comprising:
- forming a first conductor, a second conductor, an oxide semiconductor layer, a first wiring, an insulating film, a second wiring, and a first insulating layer, the oxide semiconductor layer being provided between the first conductor and the second conductor and extending in a first direction, the first wiring surrounding the oxide semiconductor layer, the insulating film provided between the first wiring and the oxide semiconductor layer, the second wiring being provided on the second conductor, and the first insulating layer being provided on a side surface of the second wiring and having a first void;

forming a lower insulating layer above the first insulating layer;

partially removing the lower insulating layer to form a depression;

forming an upper insulating layer on the lower insulating layer and thus covering the depression to form a second void between the lower insulating layer and the upper insulating layer; and performing a heat treatment under an atmosphere containing oxygen after forming the second void, wherein the oxide semiconductor layer has two ends in the first direction, one end of the oxide semiconductor is directly connected to the first conductor, and another end of the oxide semiconductor is directly connected to the second conductor.

11. The method according to claim 10, wherein the first wiring extends in a second direction across the first direction;

the second wiring extends in a third direction across each of the first direction and the second direction; and the first void and the second void at least partially overlap with each other in a plane having the second direction and the third direction.

12. The method according to claim 10, wherein the second conductor is provided on the oxide semiconductor layer and includes a conductive oxide layer containing a metal oxide.

13. The method according to claim 10, wherein the first wiring extends in a second direction across the first direction, the second wiring extends in a third direction across each of the first direction and the second direction, and the second void extends along the third direction.

14. The method according to claim 10, wherein the first wiring extends in a second direction across the first direction, the second wiring extends in a third direction across each of the first direction and the second direction, and a plurality of the second voids are formed along the third direction.

15. The method according to claim 10, further comprising forming a film on an inner surface of the depression, the film being configured to occlude hydrogen and permeate oxygen, wherein the film contains at least one metal element selected from the group consisting of titanium, tantalum, hafnium, lanthanum, and zirconium, and oxygen or nitrogen.

16. The method according to claim 15, wherein the film contains oxide or nitride of at least one metal selected from the group consisting of titanium, tantalum, hafnium, lanthanum, and zirconium.

17. The method according to claim 15, wherein the film is configured to occlude hydrogen and permeate oxygen.

18. The method according to claim 15, further comprising forming a silicon nitride film on the film.

* * * * *